United States Patent
Rudisill et al.

(10) Patent No.: US 8,651,711 B2
(45) Date of Patent: Feb. 18, 2014

(54) MODULAR LIGHTING SYSTEM AND METHOD EMPLOYING LOOSELY CONSTRAINED MAGNETIC STRUCTURES

(75) Inventors: Charles A. Rudisill, Apex, NC (US); Daniel John Whittle, Bellingham, WA (US)

(73) Assignee: Apex Technologies, Inc., Holly Springs, NC (US)

( * ) Notice: Subject to any disclaimer, the term of this patent is extended or adjusted under 35 U.S.C. 154(b) by 243 days.

(21) Appl. No.: 13/211,533

(22) Filed: Aug. 17, 2011

(65) Prior Publication Data

US 2013/0044501 A1 Feb. 21, 2013

Related U.S. Application Data

(63) Continuation-in-part of application No. 12/698,731, filed on Feb. 2, 2010, now Pat. No. 8,187,006.

(60) Provisional application No. 61/206,609, filed on Feb. 2, 2009, provisional application No. 61/279,391, filed on Oct. 20, 2009, provisional application No. 61/402,588, filed on Sep. 1, 2010, provisional application No. 61/456,921, filed on Nov. 15, 2010, provisional application No. 61/514,017, filed on Aug. 1, 2011.

(51) Int. Cl.
*F21V 21/00* (2006.01)
*F21V 29/00* (2006.01)

(52) U.S. Cl.
USPC ...................... 362/398; 362/249.02

(58) Field of Classification Search
USPC ............................. 362/398, 249.02
See application file for complete search history.

(56) References Cited

U.S. PATENT DOCUMENTS

| 4,719,549 A | 1/1988 | Apel |
| 4,861,273 A | 8/1989 | Wenman et al. |

(Continued)

FOREIGN PATENT DOCUMENTS

| CA | 2700924 A1 | 4/2009 |
| DE | 202007017609 U1 | 5/2008 |

(Continued)

OTHER PUBLICATIONS

Corresponding PCT International Publication No. WO 2012/030536 A2, publication date Mar. 8, 2012, Applicant Apex Technologies, Inc.

*Primary Examiner* — Stephen F Husar
*Assistant Examiner* — James Cranson, Jr.
(74) *Attorney, Agent, or Firm* — James G. Passé; Passé Intellectual Property, LLC

(57) ABSTRACT

A lighting system including modules containing LEDs or other electroluminescent devices and loosely constrained magnetic structures at least partially contained within cavities in the module substrate that are connected to fixtures under magnetic force. The loosely constrained magnetic structures accommodate mechanical variations in the system and provide a method to connect modules mechanically, electrically and thermally to different fixtures or positions in fixtures without tools. The relatively short distance separating magnetic structures provides high connection forces with the use of relatively small magnets. Magnets and electrical contacts are not located directly between the LED subassembly and the fixture, which provides higher thermal conductivity pathways to remove heat from the LEDs. Biasing members may be used to increase thermal contact. Magnetic structures may, but are not required, to conduct electricity. Fixtures that attach to modules include rails, sockets, heat sinks and two-dimensional structures with recessed electrodes for improved electrical safety.

36 Claims, 15 Drawing Sheets

(56) References Cited

U.S. PATENT DOCUMENTS

| | | | |
|---|---|---|---|
| 5,027,262 A | 6/1991 | Freed | |
| 5,154,509 A | 10/1992 | Wulfman et al. | |
| 5,342,204 A | 8/1994 | Och | |
| 5,397,238 A | 3/1995 | Och | |
| 5,729,925 A | 3/1998 | Prothero | |
| 5,833,358 A | 11/1998 | Patik | |
| 6,089,884 A | 7/2000 | Klaus | |
| 6,244,733 B1 | 6/2001 | Fong et al. | |
| 6,380,683 B1 | 4/2002 | Kahn | |
| 6,394,626 B1 | 5/2002 | McColloch | |
| 6,540,372 B2 | 4/2003 | Joseph | |
| 6,796,680 B1 | 9/2004 | Showers et al. | |
| 6,949,772 B2 | 9/2005 | Shimizu et al. | |
| 7,066,739 B2 | 6/2006 | McLeish | |
| 7,092,257 B2 | 8/2006 | Westerheide | |
| 7,114,827 B2 | 10/2006 | Halter | |
| 7,137,727 B2 | 11/2006 | Joseph et al. | |
| 7,172,332 B2 | 2/2007 | Mobarak et al. | |
| 7,178,941 B2 | 2/2007 | Roberge et al. | |
| 7,244,058 B2 | 7/2007 | DiPenti et al. | |
| 7,329,024 B2 | 2/2008 | Lynch et al. | |
| 7,438,449 B2 | 10/2008 | Lai et al. | |
| 7,637,746 B2 | 12/2009 | Lindberg et al. | |
| 7,703,951 B2 | 4/2010 | Piepgras et al. | |
| 7,712,926 B2 | 5/2010 | Matheson | |
| 7,722,230 B2 | 5/2010 | Chien | |
| 7,726,974 B2 | 6/2010 | Shah et al. | |
| 7,806,569 B2 * | 10/2010 | Sanroma et al. | 362/398 |
| 7,813,131 B2 | 10/2010 | Liang | |
| 7,828,464 B2 | 11/2010 | Wang et al. | |
| 7,866,850 B2 | 1/2011 | Alexander et al. | |
| 7,896,527 B2 | 3/2011 | Chen | |
| 7,972,054 B2 | 7/2011 | Alexander et al. | |
| 7,997,774 B2 | 8/2011 | Liddle | |
| 8,109,652 B2 | 2/2012 | Chen | |
| 8,202,012 B2 | 6/2012 | Stewart et al. | |
| 8,232,745 B2 | 7/2012 | Chemel et al. | |
| 8,240,894 B2 | 8/2012 | Sanroma et al. | |
| 8,348,492 B2 * | 1/2013 | Mier-Langner et al. | 362/648 |
| 8,425,082 B2 * | 4/2013 | Wang | 362/249.02 |
| 2006/0152945 A1 | 7/2006 | Lantzsch et al. | |
| 2007/0285949 A1 | 12/2007 | Lodhie et al. | |
| 2008/0019103 A1 | 1/2008 | Kim | |
| 2009/0279298 A1 | 11/2009 | Mier-Langner et al. | |
| 2009/0284988 A1 | 11/2009 | Snagel et al. | |
| 2010/0076527 A1 | 3/2010 | Hammond et al. | |
| 2010/0314655 A1 | 12/2010 | Thompson | |
| 2010/0321937 A1 | 12/2010 | Von Bommel et al. | |
| 2011/0069508 A1 | 3/2011 | Krijn et al. | |
| 2011/0286225 A1 * | 11/2011 | Konishi et al. | 362/398 |
| 2012/0075857 A1 | 3/2012 | Verbrugh | |
| 2012/0224375 A1 | 9/2012 | Zaderej et al. | |

FOREIGN PATENT DOCUMENTS

| | | |
|---|---|---|
| EP | 1733 653 A2 | 12/2006 |
| GB | 2 413 712 A | 11/2005 |

* cited by examiner

SECTION C-C

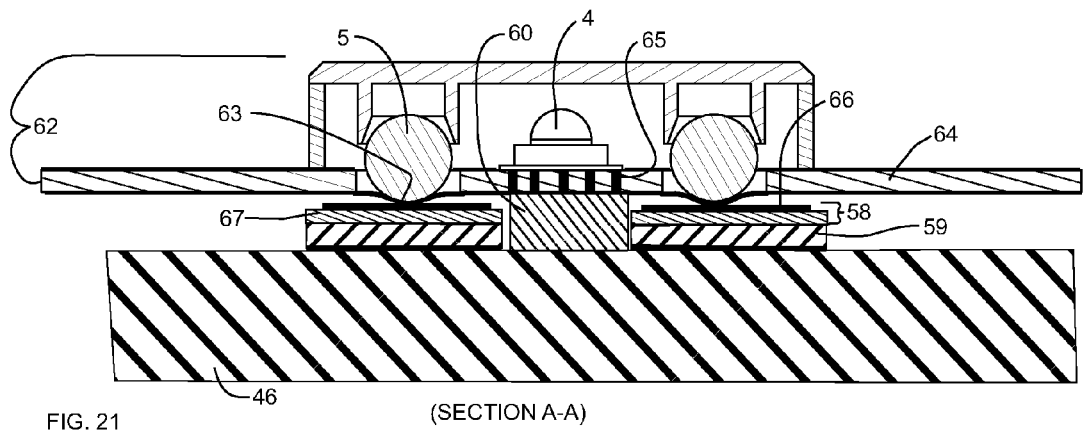
FIG. 21 (SECTION A-A)
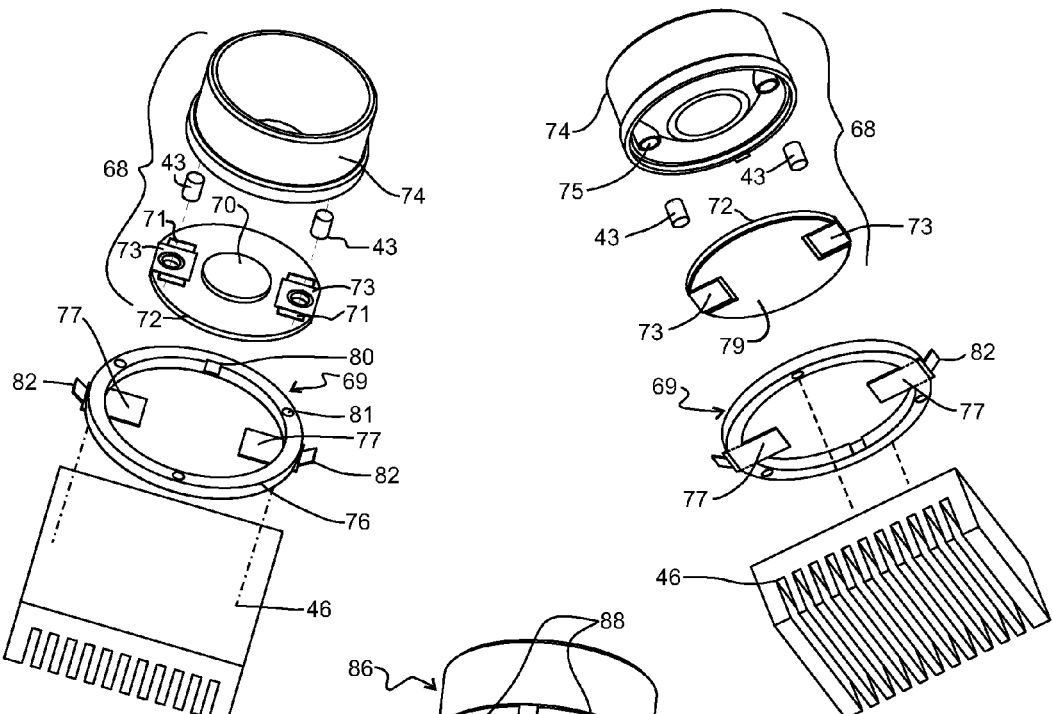
FIG 22
FIG. 23
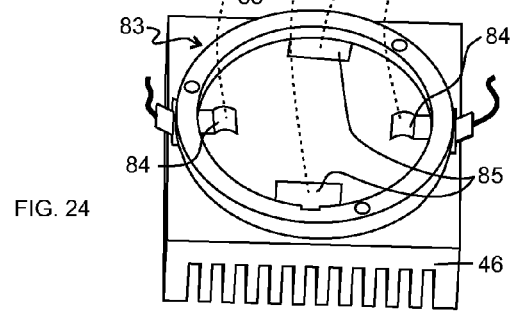
FIG. 24

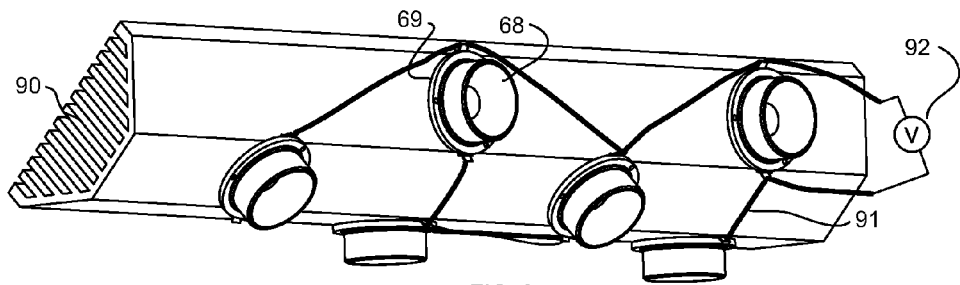
FIG. 25
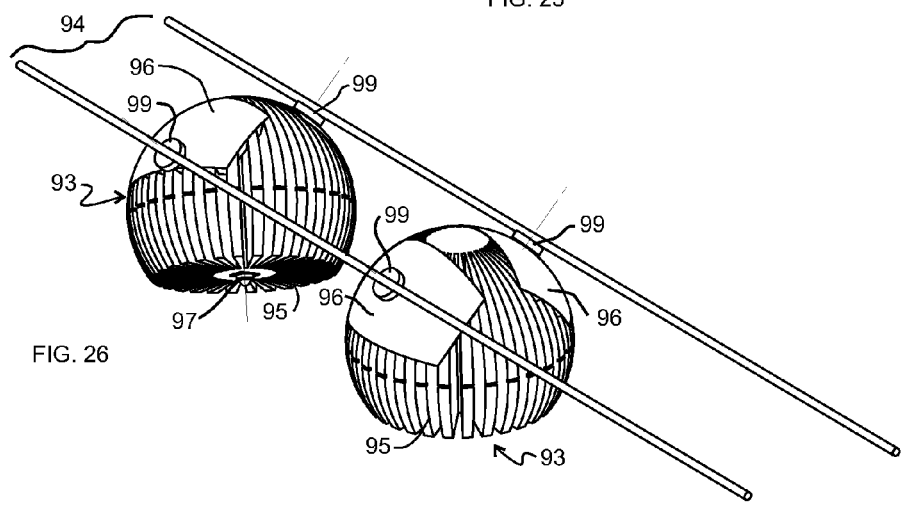
FIG. 26
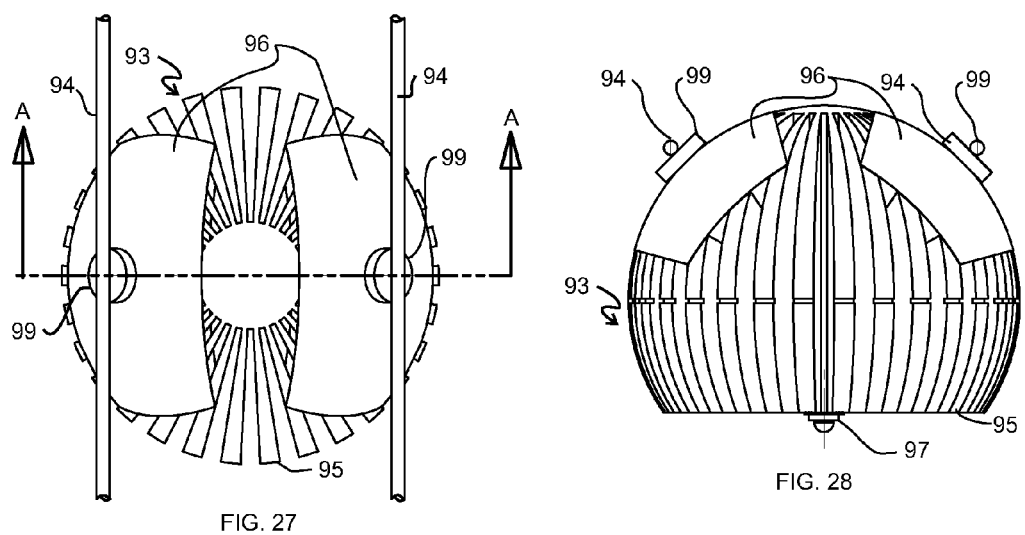
FIG. 27
FIG. 28

SECTION A-A

SECTION A-A

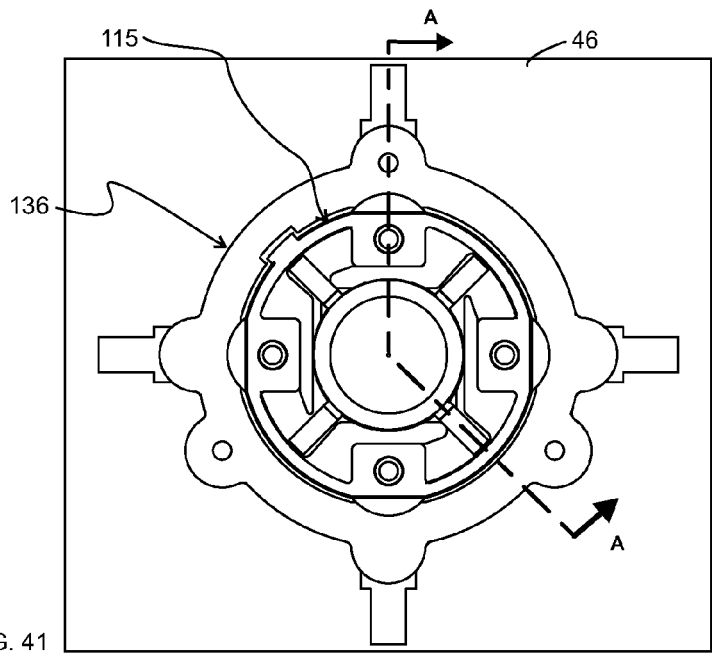
FIG. 41
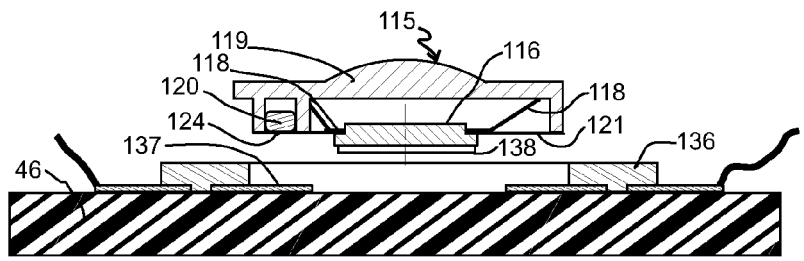
FIG. 42  SECTION A-A (UNASSEMBLED)
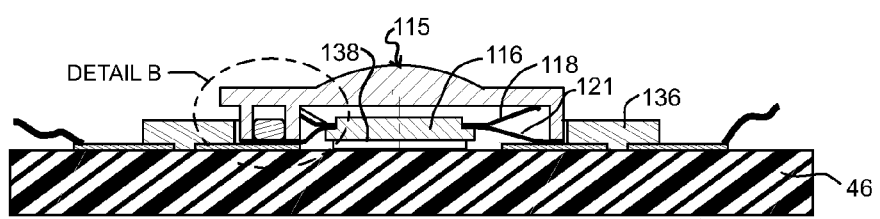
FIG. 43  SECTION A-A (ASSEMBLED)
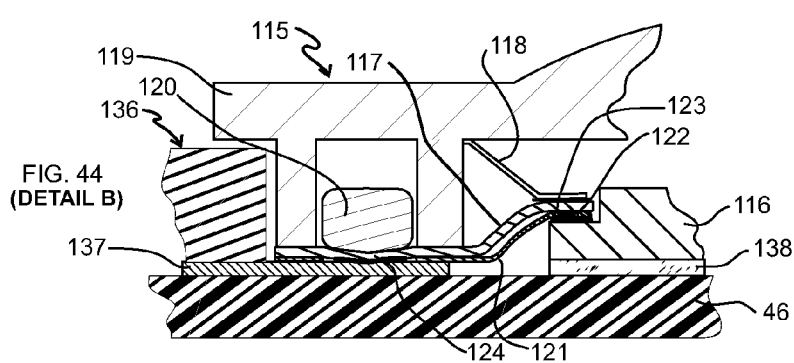
FIG. 44 (DETAIL B)

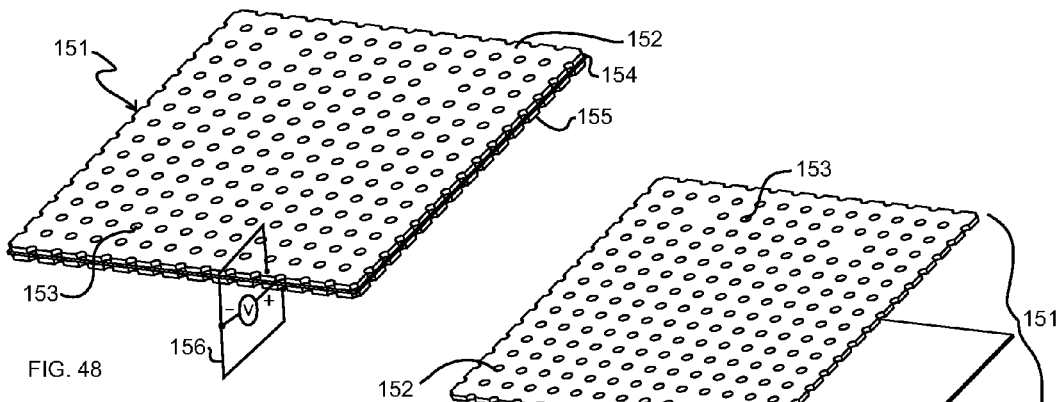
FIG. 48
FIG. 49
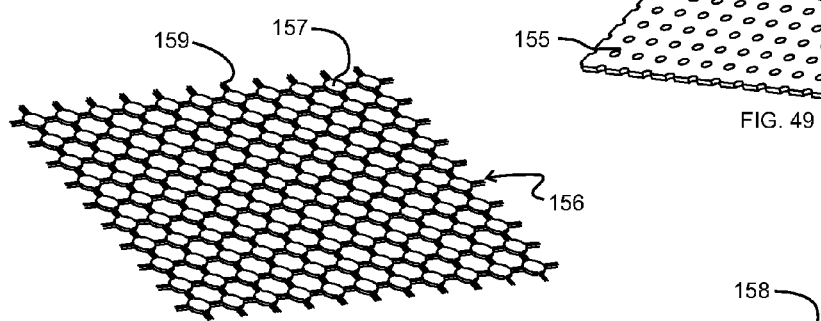
FIG. 50
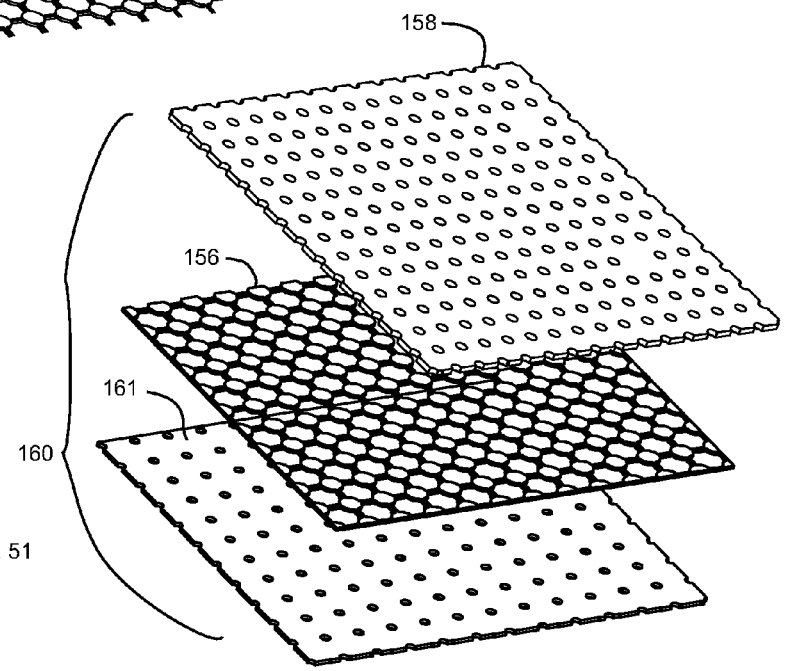
FIG. 51

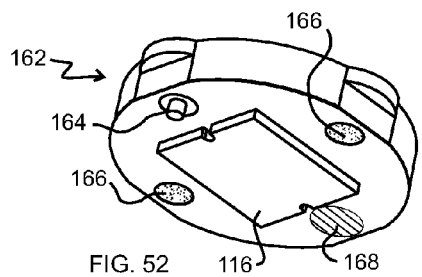
FIG. 52
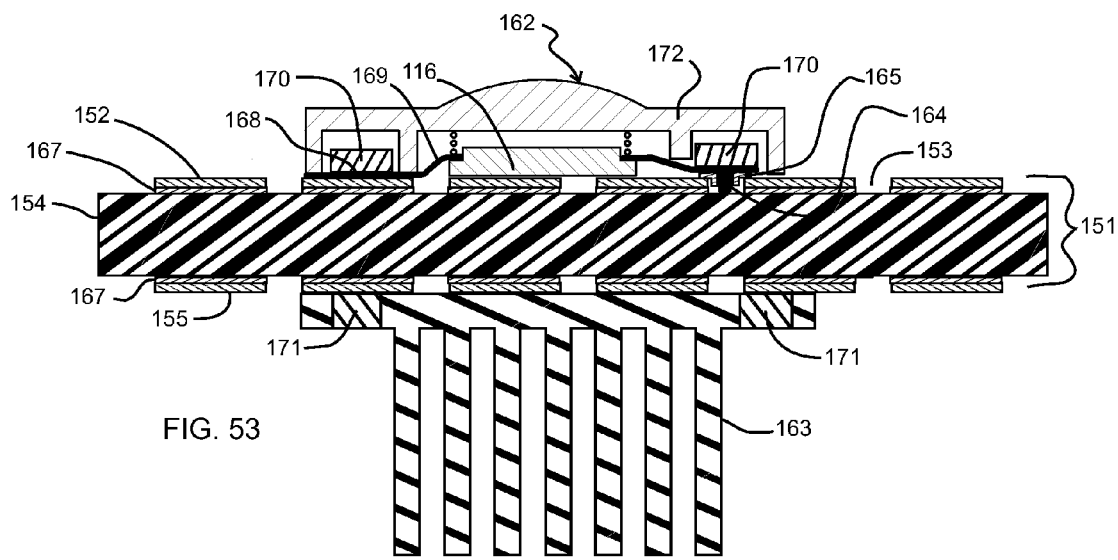
FIG. 53
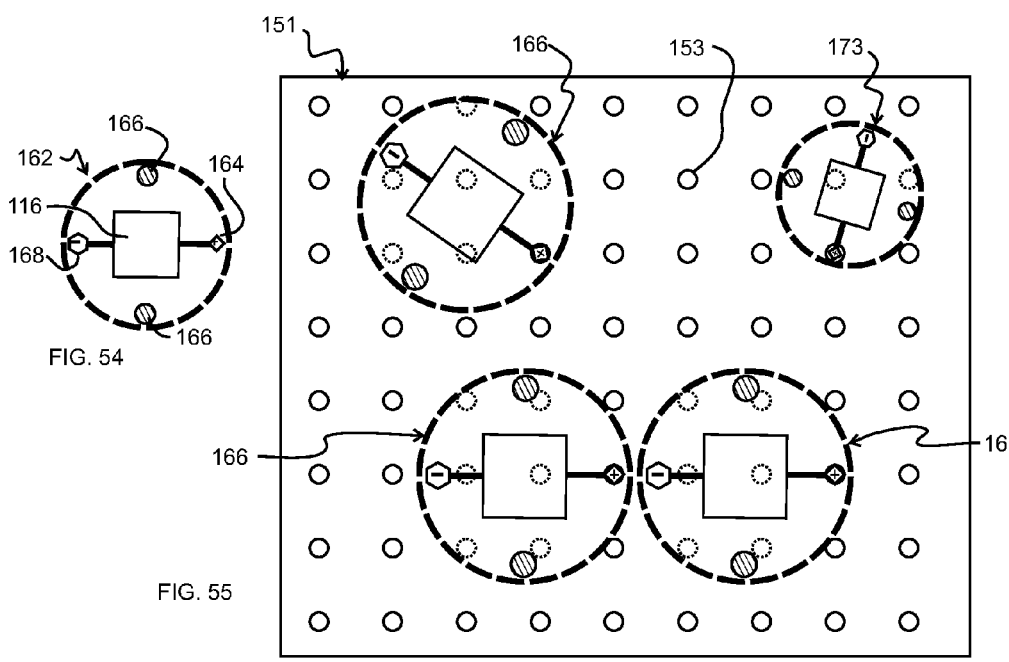
FIG. 54
FIG. 55

MODULAR LIGHTING SYSTEM AND METHOD EMPLOYING LOOSELY CONSTRAINED MAGNETIC STRUCTURES

This application is a continuation-in-part of U.S. non-provisional application Ser. No. 12/698,731 filed on Feb. 2, 2010 which claims priority of U.S. provisional application No. 61/206,609, filed on Feb. 2, 2009 and U.S. provisional application No. 61/279,391 filed on Oct. 20, 2009; and U.S. provisional application No. 61/402,588 filed on Sep. 1, 2010; U.S. provisional application No. 61/456,921 filed on Nov. 15, 2010; and U.S. provisional application No. 61/514,017 filed on Aug. 1, 2011, all of which are included herein in their entirety by reference.

COPYRIGHT NOTICE

A portion of the disclosure of this patent contains material that is subject to copyright protection. The copyright owner has no objection to the reproduction by anyone of the patent document or the patent disclosure as it appears in the Patent and Trademark Office patent files or records, but otherwise reserves all copyright rights whatsoever.

BACKGROUND OF THE INVENTION

1. Field of the Invention

The present invention relates to modular lighting. In particular, it relates to magnetically restrained lighting systems and methods of use.

2. Description of Related Art

Modular track lighting systems have been available for decades and were originally designed to use incandescent light bulbs. These systems typically have included fixtures that are mounted to rigid tracks with spring contact tabs that are rotated into contact with linear conductors, thereby providing electrical power to the lighting module. For electrical mains voltage safety, these linear conductors are shielded from direct finger contact. More recently, suspended rail and wire systems have been introduced that include insulation piercing contacts and/or use inherently safe lower voltages. These systems generally require tools for mounting individual lighting fixtures.

In recent years, there has been interest in solid-state lighting systems, in particular, light emitting diodes ("LEDs"). These systems tend to be smaller in size, longer-lived, and more efficient than standard incandescent light bulbs. Magnetic attachment of LED lighting modules has been proposed, for example, in U.S. Pat. No. 7,726,974 and U.S. Pat. No. 7,806,569 to eliminate the need for a tool to attach the LED lighting modules along the length of the track.

Although visible LEDs are efficient in that they do not generate wasteful infrared radiation and they generate less heat than incandescent systems, they do create some waste heat that must be removed from the emitting junction by thermal conduction to avoid degradation in performance or reliability since they are more sensitive to heat than incandescent systems. Existing magnetic attachment systems have limited thermal cooling efficiencies which restrict their power capability for general illumination applications with high-brightness LED assemblies since the greater the number of LEDs, the greater the heat generation and the greater the degradation problem. The proposed systems in U.S. Pat. Nos. 7,726,974 and 7,806,569 rely upon cooling by thermal conduction directly through the magnetic material and convection cooling through passive air movement near the LED subassembly. Neodymium and ferrite magnets have thermal conductivities that are approximately 10, 20, and 40 times less than that of iron, aluminum, and copper, respectively. The thermal conductivity of air is three orders of magnitude less than iron. Excess thermal interfaces in the conduction path between the LED subassembly and the external heat sink generally add to cooling inefficiencies.

Existing magnetically attached systems often include interface elements that require precision mechanical tolerances for proper attachment. Planar magnets and rigid contacts "rock" on non-planar surfaces reducing contact areas for thermal conduction or the ability to accommodate mechanical variation. Also, the number of electrical contacts that can be attached uniformly is limited. Thermal expansion effects further increase the level of precision required in these interfacing parts. Note also that lighting modules that are exposed to heat often change tolerances due to frequent heating and cooling cycles.

In addition to track lighting systems, the higher performance of solid state lighting has generated interest in replacement systems suitable for existing incandescent screw sockets. Available one-piece standard screw-in incandescent bulb replacements using solid state lighting combine less reliable electrolytic capacitors with higher reliability and more expensive LED subassemblies in a single field replaceable unit. Differences in functionality such as dimming in the integrated electronics result in stocking completely different units or including unused functionality and unnecessary parts cost. Although two piece designs have been proposed, these proposals have not provided details on how a mechanical, electrical, and thermally efficient mounting of the LED subassembly can be accomplished to the socket with higher modularity.

Even in current solid state lighting systems that are not meant to fit in an existing incandescent lighting fixture, differences in functional attributes including power output, emitted light spectral, or directional characteristics create increased costs to businesses and consumers. A need exists for a highly-modular, robust system for creating reliable interconnecting between lighting system elements.

Rapidly rising prices for rare earth elements has increased the cost of relatively strong magnets and as such, while useful, they are becoming impractical for lower cost lighting systems. Existing lighting systems fail to simultaneously optimize the mechanical, electrical, and thermal performance especially with smaller, less expensive magnets which require the stronger magnets to properly make and retain a connection.

Insulation piercing contacts have been proposed for electrical safety and environmental considerations, but the mechanical forces required to pierce insulators may be higher than the magnetic force available even with use of rare earth magnets. Insulation piercing contacts permanently change the system which may introduce aesthetic or safety issues when a module is removed or moved within the system. There is a need for alternate approaches for electrical safety that provide greater flexibility in attachment without damage or requiring a onetime attachment.

Lighting modules can be difficult to seal from the environment while maintaining electrical/mechanical and thermal performance and this adds to the difficulties with magnetic attachment of an electrical connection for a lighting system.

While some systems attempt to address one or more of these problems, a need still exists for a solid state lighting system solution that provides a robust mechanical, electrical and/or thermal interface attachment mechanism using magnetic materials that is modular and includes a wide range of fixture mounting options.

BRIEF SUMMARY OF THE INVENTION

The present invention relates to the discovery and invention wherein a magnetic connection also includes the electrical connection between a lighting module and a lighting fixture without requiring mechanical precision where parts interface. In further embodiments, the inclusion of a heat sink for removing heat further improves the present invention.

Accordingly in one embodiment there is a lighting system comprising:
a) a lighting module comprising one or more electrically powered LEDs;
b) a thermal conduction pathway for removing heat from the one or more LEDs;
c) a lighting fixture for attaching a lighting module comprising electricity for powering the one or more LEDs;
d) a magnetic connection between the lighting module and the lighting fixture for attaching comprising at least one loosely constrained magnet or material to which a magnet is attracted wherein the thermal conduction pathway does not essentially pass through the magnet; and
e) wherein the electricity is delivered to the one or more LEDs where the lighting module is connected to the lighting fixture via the magnetic connection.

Another embodiment is a lighting system comprising:
a. a lighting module comprising one or more electrically powered LEDs;
b. a thermal conduction pathway;
c. a lighting fixture for attaching a lighting module comprising electricity for powering the one or more LEDs;
d. a magnetic connection wherein components of the magnetic connection are fixed in position; and
e. wherein the one or more LEDs are mechanically biased to be held against the thermal conduction pathway when the light module is magnetically attached to the light fixture.

BRIEF DESCRIPTION OF THE DRAWINGS

FIG. 21 is an example of an FPC laminated to ferromagnetic electrode.

FIG. 22 is a top isometric exploded view of a lighting module and socket with wrapped flexible magnetic contacts.

FIG. 23 is a bottom isometric exploded view of a lighting module and socket with wrapped flexible magnetic contacts.

FIG. 24 is an isometric view of a lighting module with magnetic and mechanical spring contacts.

FIG. 25 is an example of a facetted heat sink with multiple lighting modules and sockets attached.

FIG. 26 is an isometric view of rotary magnetic lighting modules installed on cylindrical electrode tracks.

FIG. 27 is a top view of a rotary lighting module of FIG. 26.

FIG. 28 is a side view of a rotary lighting module of FIG. 26.

FIG. 41 is a top view of thermal MLM, socket and heat sink.

FIG. 42 is a section view of FIG. 41 of thermal MLM prior to installation into socket.

FIG. 43 is a section view of FIG. 41 module assembled into socket.

FIG. 44 is a detail view of contact area of MLM and base of FIG. 41.

FIG. 48 is an isometric view of an electrode grid.

FIG. 49 is an exploded isometric view of an electrode grid.

FIG. 50 is an isometric view of a selectively shaped ferromagnetic grid layer structure.

FIG. 51 is an exploded isometric view of a selectively shaped ferromagnetic grid layer structure.

FIG. 52 is a bottom isometric view of a grid lighting module.

FIG. 53 is a section view of a grid lighting module and heat sink module attached to a grid.

FIG. 54 is a bottom view of a grid lighting module.

FIG. 55 is a top view of grid lighting modules mounted to a grid.

DETAILED DESCRIPTION OF THE INVENTION

Figure 1:
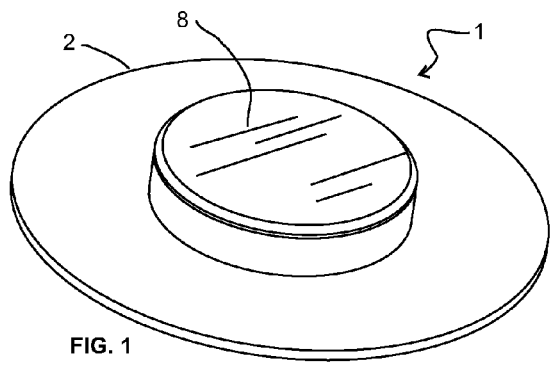
FIG. 1 is a top isometric view of a magnetic lighting module ("MLM").

While this invention is susceptible to embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings. This detailed description defines the meaning of the terms used herein and specifically describes embodiments in order for those skilled in the art to practice the invention.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

The terms "about" and "essentially" mean ±10 percent.

Reference throughout this document to "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The drawings featured in the figures are for the purpose of illustrating certain convenient embodiments of the present invention, and are not to be considered as limitation thereto. Term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

As used herein a "lighting system" refers to a system of devices, modules, fixtures, etc., which when combined, provide lighting in a particular environment. In this particular invention it refers to an LED lighting system and in general a two part system as described below and shown in the figures and claims.

As used herein for the purposes of this disclosure, the term "module" should be understood to mean any individual element of the system that may be connected to a separate device (a fixture or another module) using a magnetic connection force.

As used herein a "light module" or "lighting module" should be understood to be a module that includes an element that radiates electromagnetic energy, e.g. light. The element may be one or more packaged or unpackaged light emitting diode, or LED, with an inorganic or organic active element, a lamp, an electroluminescent material, or any other material or component with an electro-optic energy conversion. Examples include lamps for track lighting, chandeliers and sockets or extended lighting arrays in buildings or other temporary or permanent structures, vehicles, or vessels. As used herein, "one or more LEDs" refers to a single or multiple LED and includes an "LED subassembly" or "LED light engine" and should be understood to generally comprise one or more semiconductor die or other solid state light emitting structures which are packaged on a shared electronic substrate. It indicates that the LED is electrically powered by appropriate electrical current either directly or by use of a transformer converting one type of electrical power (AC) to another type, voltage or amperage.

Although the terms one or more LED and LED subassembly are used in illustrating the inventive concepts contained in this disclosure, this is for descriptive convenience and does not preclude the substitution of other types of lighting technologies for the LEDs where magnetic attachment and heat dissipation are at issue for improved performance. The spectrum of electromagnetic energy associated with a light module is not restricted to the visible region, but may consist of electromagnetic energy with frequencies outside the visible region. The lighting modules described herein may also contain passive and active electrical components to facilitate features such as current or voltage control, data communication to or from the module, and functional attributes such as intensity, spectral changes, pulsing, etc.

A lighting system includes at least one "lighting module" connected to a separate "lighting fixture" via a magnetic connection. A "magnetic connection" for the lighting system includes at least one connection between the lighting module and the lighting fixture for attaching the lighting module to the lighting fixture wherein the electricity from the lighting fixture is delivered to the lighting module to power the one or more LEDs as a result of the magnetic connection.

As used herein the "lighting fixture" is a device which provides electrical power to a lighting module when the lighting module is connected to the lighting fixture. Examples of "lighting fixtures" include electrical power source or data connections such as sockets, connectors, tracks, rods, rails, wires or grids; heat sinking assemblies; modules that are used to extend the electrical and/or mechanical extent of any system; or another light module that is powered.

A module "substrate" should be understood to be at least a part of the structure that mechanically supports an individual light emitting component, multiple LEDs, or an LED subassembly in the lighting module. Although planar substrates are illustrated in this disclosure, the inventive concepts should be understood to be applicable to other geometries. In general, substrates in this disclosure can be an epoxy-glass (e.g., FR4) printed circuit board ("PCB") material, ceramic substrate, metal-core PCB, rigid-flex PCB, molded circuit substrate, flexible circuitry, combinations of these, or other electronic substrate materials or assemblies known in the electronic packaging arts.

As used herein, a "thermal conduction pathway", or a "heat sink" should be understood to be an element that is incorporated into a lighting system to remove or redistribute heat from a light module, LED or other heat source through thermal conduction with these heat sources. A passive heat sink commonly comprises a metal structure of greater physical volume than the heat source element in physical contact with the heat source directly or through additional material layers to create a thermal conduction pathway. These elements may in turn transfer heat to other elements or the surrounding environment, for example, by conduction, convection, or radiation processes. External heat sinks are heat sinks that are designed to be separable from a module or fixture. The heat sinks may include channels, fins or other geometries to increase surface area, fluid-filled heat pipes and/or active cooling technologies including fans, thermoelectric coolers, or other heat transfer and management technologies. Heat sinks in some embodiments of this disclosure may also participate in supplying electrical power directly by electrical conduction or by mechanically supporting electrical conducting elements. It should be understood that the LEDs or other light sources, may be mounted on an intermediate heat-conducting component, including either a passive heat spreader/conductor, or a substrate containing circuitry and other components. These substrates onto which light sources are mounted may contain other thermal features such as thermal vias and integrated thermal conductive components that are subsequently coupled to the modular heat sinks and grids described herein.

Thermal conductivity of a material is dependent upon material composition and environmental conditions. The removal of waste heat by thermal conduction is also dependent upon the geometries of system elements. In this disclosure, whether a material would improve cooling of heat sources is relative to other materials in the system. In a general sense, materials that are typically considered to have relatively high thermal conductivity include metals, metal alloys and some metal oxides, semiconductors, some ceramics, diamond and other forms of carbon. Specialty materials called "thermal grease", "thermal adhesives", "thermal pads" or other filled or composite materials or structures may be incorporated into modules or fixtures to bridge interfaces to improve thermal conduction, especially if air would be included in the thermal conduction path otherwise. Although some of these specialty materials have characteristic material thermal conductivities on the order of magnetic materials, they have the thermal efficiency advantage over magnetic materials of being of practical use in thinner layers that conform to local mechanical variations between rigid parts. Thermal conduction pathways may comprise these specialty materials.

If not otherwise noted, "top" or "front" refers to the principal emitting side of the light module, and "bottom" or "back" refers to the side of the module which attached to the light fixture and in some embodiments is attached to the heat sink. These directions are for convenience in referring to the illustrated embodiments and are not meant to be attached to the top or bottom of a module with the inventive concepts disclosed. Similarly, the terms "hole", "cored space", or "cavity", when referring to a structure should be interpreted to refer to an open space or void that extends at least partially through the thickness of the structure. The term "through hole" or "window" should be interpreted as an opening or aperture that forms a passage that extends from one side of a structure to another side of the structure.

As is well known, magnetic forces may exist between pairs of magnets and between a magnet and a material attracted to a magnet. Magnets and materials attracted to magnets comprise rare earth and ferromagnetic materials. Rare earth magnets comprise neodymium and samarium-cobalt alloys for example. Ferromagnetic materials comprise iron, nickel, cobalt, gadolinium and alloys comprised of these materials such as alnico. The properties of the poles or magnets are also well-known, as is the ability to form magnets from cast and sintered material or magnetic particle filled elastomers and polymers. As a result, as used herein for the purposes of this disclosure, the term "magnetic connection", "magnetic structure" or "magnetic material" should be understood to include either a magnet or a material attracted to a magnet for the purpose of attaching the lighting module to the lighting fixture.

As used herein the phrase "magnetic connection" for the purposes of this disclosure includes the combination of at least one magnet and at least one ferromagnetic material (which also could be a magnet) for the purpose of making a magnetic connection. The ferromagnetic material in such a combination may be used to influence the distribution of the magnetic flux lines of the magnet. The ferromagnetic material in such a combination may also be used to shape contact geometries. Although not specifically shown in the figures, it is understood that in addition to "permanent magnets," "temporary magnets" may be created by magnetic induction to create magnetic forces that could be used with the lighting modules and systems illustrated. Unless there is specific mention to orientation of magnetic poles, it should be understood that at least one or the other of the two magnetic structures creating an electrical contact pair from a magnetic attraction is a magnet. Due to the interchangeability of which element in the pair is a magnet, it should be understood for the purposes of this disclosure that a description of a contact pair in which one magnetic structure is described as a magnet and the other as a magnetic material also discloses an equivalent structure in which the materials of the magnetic structures of both halves are switched. In addition, a magnetic material in embodiments discussed herein may be replaced with a magnet if one of the magnets in a contact pair is free to reorient magnetic poles to create an attractive force, or is by other means mechanically oriented such that there is magnetic attraction between the adjacent magnetic poles.

As used herein a "loosely constrained" magnet or a "moving magnet" for the purposes of this disclosure is to be understood to be a magnet or magnetic structure that has some limited range of motion under magnetic forces between a module and fixture as a result of its size and shape relative to physical constraints provided by the portions of a module in which it is located. The loosely constrained magnet of a fixture is movably connected to the unmovable portion of the fixture, that is, the relative position of these two bodies can change over a limited range. The loosely constrained magnet is preferably retained in the module mechanically, but may be retained by magnetic force in the absence of mechanical retention features. To be loosely constrained for the case of a magnet attached with adhesive to an electronic substrate, such as a flex circuit or metal foil, the substrate must be sufficiently flexible to readily locally deform as a result of the magnets attractive force to the other non-magnetic element through a distance longer than mechanical tolerances of a particular interface and design. For example, spherical, neodymium magnets of 3 mm diameter are capable of deforming 0.1 mm copper foil by several times the foil's thickness perpendicular to the foil and would be sufficiently loose in this direction to have a practical motion range for interface mechanical tolerances.

Magnetic attachment forces may be supplemented with other mechanical attachment elements, particularly when lighting system application environments are extreme or there is less need for repositioning of elements. Magnetic structures may be coated or filled with material that increases electrical conductivity compared to the characteristic electrical conductivity of magnets which is not practical for most electronics purposes.

Magnetic structures and/or electrical contacts used in embodiments disclosed herein may be shaped to influence mating contact geometries and associated Hertz stress of an electrical contact pair. The shape of the magnetic structure may contribute at least temporarily to the Hertzian contact stress profile through deformation of a compliant contact. Other structures including asperities, permanent deformations, and additional conducting material attached to the contact surface may be incorporated into one or more contact surfaces to contribute to the Hertzian contact stress profile as is well-known in the art of electrical interconnects. In one embodiment the magnets are globular in shape and in other embodiments they are cylindrical, which are readily available magnetic shapes. There is no requirement that a particular shape is utilized and one skilled in the art can utilize essentially any magnet shape as desired.

As used herein the term "low voltage" when used in an electrical safety perspective in this disclosure should be understood to be an AC or DC voltage that is lower than the voltage at which the risk of injury to humans from electrical shock is considered to be acceptably small, which is generally determined by some electrical safety standards to be in the range of tens of volts or less.

The term "spring" or "spring member" for the purposes of this discussion is a structure that is made of resilient material. Highly resilient materials include spring steel, stainless steel, phosphor bronze, and other metals as well as elastic foams, various forms of elastomeric acting polymers, and rubbers. For the purposes of this disclosure, springs of different materials may be used to provide a compressive mechanical bias force at the interface between two bodies. Structures including some substrates and electrical contact assemblies may also have some inherent resiliency that may provide some spring-like mechanical bias or loading.

This disclosure describes methods and designs for producing modular lighting systems suitable for LED or other emissive technologies. LED lighting modules disclosed employ magnetic attachments to provide electrical interconnection for power and control, and mechanical retention and/or thermal conduction path to a heat sink. In some embodiments, the system comprises a ferromagnetic track or grid system that may be easily assembled with a variety of alternate heat sinks designed for a specific lighting application's thermal, environmental, mechanical, and industrial-design constraints. In some embodiments, the electrical track or grid system contains a ferromagnetic or magnetic attachment component and a thermal interface conduction path to a heat sink onto which a lighting module may be attached at multiple positions. Lighting modules containing permanent magnets are magnetically attached to the track/grid system, simultaneously providing electrical, mechanical, and thermal attachment. Also disclosed are socket style magnetic lighting modules, other examples of modules containing integral heat-sinks and lighting modules with pivoting magnetic connections.

According to one aspect of the disclosure, a lighting module comprises one or more loosely constrained magnets positioned in a cavity or through a hole of a substrate that is associated with an LED lighting sub-assembly or the lighting module. These moving magnets are attracted to magnetic material in a mounting fixture and create mechanical and electrical connections to the fixture. In some embodiments, the movement of the magnets provides greater capability in accommodating mechanical variation of either side of the interface, for example, where manufacturing tolerances vary enough to require some flexibility in mounting specifications. This tolerance of mechanical variation may be accomplished by allowing the magnets to move in one, two, or three dimensions. In some embodiments, the magnets have sufficient clearance space in a cavity to self-orient to provide higher magnetic force. Of course, the location of a moving magnet may be in the fixtures instead of in the module or may be in both the module and the fixture without deviating from the inventive concepts of this disclosure.

According to some embodiments of this disclosure, the electrical contact locations are directly between the magnets of the module and the magnetic material of the fixture. Since the magnets are not located in the principal thermal conduction pathway between the LED subassembly of the module and the heat sinking interface of the fixture, the thermal conduction properties of the magnets do not substantially impact LED subassembly cooling. According to some embodiments of the disclosure, the moving magnets do not directly conduct electricity between the LED subassembly and electrical contacts in the fixture. In these cases, it is not necessary to provide an electrically conducting coating to the magnets or to use magnets that are sufficiently electrically conducting inherently to function as part of an electrical circuit.

According to some embodiments of the disclosure, magnets are loosely constrained in part by a metal foil, milled PCB or flexible circuit which forms the electrical contact or contact pad where a separable electrical interconnection is established. Various methods are proposed for forming this contact. In some embodiments, the magnet may be attached to a member that is capable of moving and/or deforming as a result of the magnets attractive force to another magnetic connection element through a distance larger than mechanical tolerances of a particular interface.

According to some embodiments of the disclosure, the cavity or through hole in the substrate containing the magnet provides a separation distance between the magnet and the magnetic material across the separable interface of less than or equal to 0.3 mm to provide a strong magnetic force of attraction even with relatively small magnets compared to the overall size of the module.

According to some embodiments of the disclosure, a flexible circuit is used to provide a wiring connection to the LED subassembly and form the electrical contact by using a metal substrate as a heat spreader for the LED subassembly.

According to some embodiments of the disclosure, the substrate has an opening directly underlying the LED subassembly to reduce the number of thermal interfaces between the LED subassembly of the module and the heat sinking fixture to which it is attached. According to some embodiments, a compressible thermal conduction pad or other thermal conducting material is positioned adjacent to the bottom of the LED subassembly. According to some embodiments, a spring or elastic structure is used to provide a biasing force on the thermal interface of the LED subassembly. According to some embodiments, the loosely retained magnets compress a thermal conduction material adjacent to the LED subassembly when the mechanical and electrical attachments are made. In some embodiments, the magnets are located symmetrically outboard of an LED subassembly to apply uniform pressure to the thermal interface.

According to some embodiments of this disclosure, the magnetic lighting modules are connected to fixtures having parallel linear electrodes in the form of ferromagnetic strips, rods or wires, sockets with ferromagnetic contacts, or planar or three-dimensional ferromagnetic electrodes. According to other embodiments of this disclosure, the electrodes are not directly made of magnetic material, but are attached to heat sinks or other structures that are made of or include magnetic material.

According to some embodiments of this disclosure, the magnetic lighting modules and lighting fixtures allow pivoting, rotational and/or translational relative movement while maintaining electrical, mechanical, and thermal connection.

According to some embodiments of this disclosure, the magnetic lighting modules have a protruding magnetic contact which connects to an inner electrode, in a grid electrode assembly on the lighting fixture.

According to some embodiments of this disclosure, auxiliary magnets which do not participate in electrical conduction are used to attach auxiliary heat sinks to a module directly or to a fixture beside or under a module or to increase the magnetic force of attraction on a module for increased retention or thermal management. Additional magnets can be utilized to attach the lighting fixture and module which do not participate in the electrical connection and or thermal connection.

Figure 2:
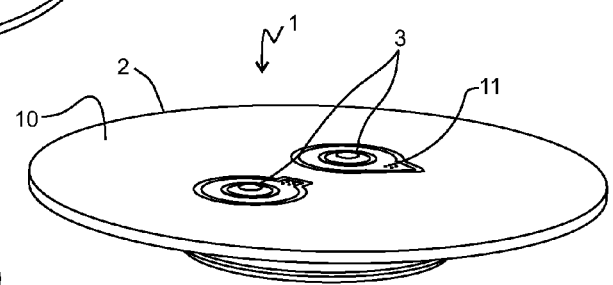
FIG. 2 is a bottom isometric view of a MLM bottom.
Figure 3:
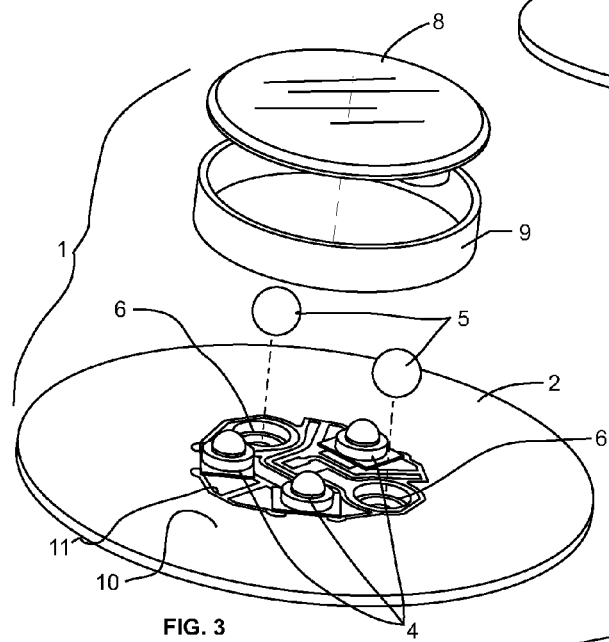
FIG. 3 is a top exploded isometric view of a MLM.
Figure 4:
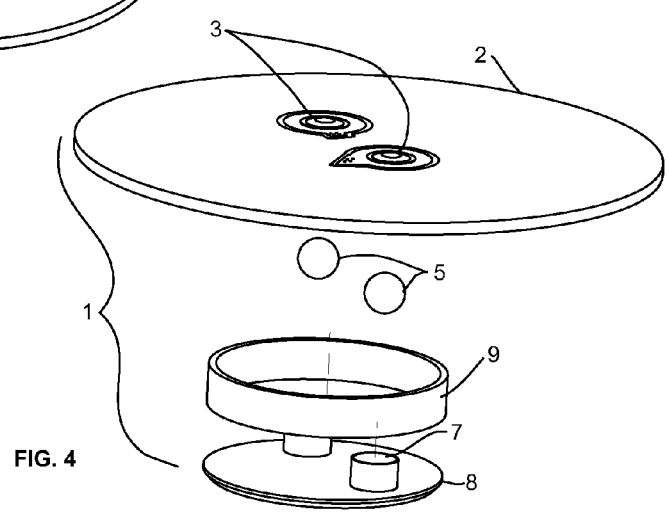
FIG. 4 is a bottom exploded isometric view of a MLM.

Now referring to the figures, the inventive concept is illustrated through reference to the figures in this disclosure and concepts disclosed in the referenced applications. FIG. 1 and FIG. 2 are top and bottom isometric views of an exemplary embodiment of a magnetic lighting module ("MLM") 1. FIG. 3 and FIG. 4 are exploded views of FIG. 1 and FIG. 2.

The exemplary magnetic lighting module of FIG. 1-FIG. 4 comprises module substrate 2 with integral contacts 3, to which a variety of electronic components may be attached such as LED subassemblies 4, and passive and active electronic components, as required for the function of the lighting module. These components may be attached using standard PCB pick-and-place and soldering processes or other electronic manufacturing processes known in the art, thereby providing an inexpensive module manufacturing process. Permanent magnets 5 are located adjacent to and in contact with the integral contacts 3. Spherical permanent magnets 5 are shown in this example, but other regular shapes such as cylinders and discs may be used, or non-regular geometric shapes may be employed.

Figure 5:
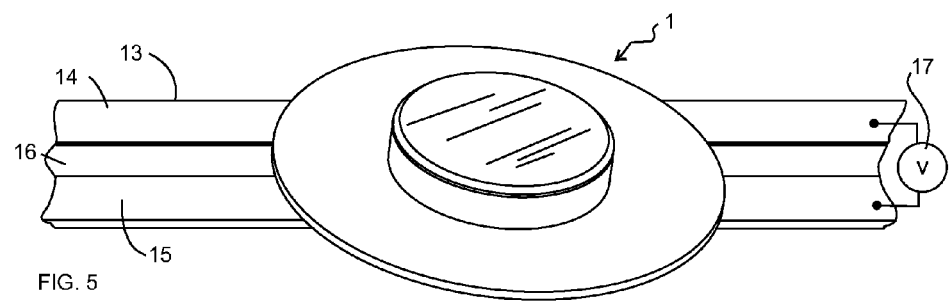
FIG. 5 is an isometric view of a flat track electrode with an MLM.

Permanent magnets 5 may be attached to integral contacts 3, such as with adhesives, or as shown in FIG. 3 and FIG. 5, may be non-rigidly located adjacent to the center of integral contacts 3 within cored structures 6. In this example, mechanical retaining features 7 incorporated into an exemplary lens 8 provide mechanical structures complimentary to the cored structures to loosely constrain magnets 5.

Completing the exemplary lighting module of FIG. 1-FIG. 4 is a spacer 9 and lens 8, which function to create a cavity containing all of the electronic components. Attaching the spacer and lens to each other and the substrate may be used to seal the electronic components from the external environment. The integral contacts 3 and the substrate 2 provide a seal on the opposite side of the module. Any open vias may be filled or covered with a solder mask or other material to seal the substrate in the area of the substrate defined by spacer 9. Spacer 9 may be constructed of materials or shaped to provide additional functionality besides sealing. For example, spacer 9 may optionally function as a heat sink by including features such as aluminum or copper fins or other structures. In another embodiment, the spacer and lens may be formed as an integral unit by a molding process using transparent material. The lens may incorporate features to modify the distribution, direction or spectral content of light emitted from the LEDs.

In this illustrative example module 1, it should be evident that all of the electrical components can be completely sealed from the environment to prevent contamination ingress to the electronic components in the center of the module. However, the outer flange, i.e., the area outside of the spacer, of the substrate 2 may function as a heat sink and/or heat spreader and may include vias and other openings extending through the substrate 1. These openings may increase the surface area available or otherwise increase convection cooling or provide a thermal conduction conduit from the electronic components sealed within the cavity described above.

Module substrate 2 would typically be an epoxy glass printed circuit board, ceramic substrate, metal-core PCB, rigid-flex PCB, molded circuit substrate, or another electronic substrate material known in the electronic packaging arts. The module substrate would typically comprise a copper-clad laminate with layers of copper 10 or other electrically conductive metal or other material with which to fabricate desired circuitry 11 by PCB and substrate manufacturing technologies known in the art of electronic manufacturing.

In an exemplary embodiment, module substrate 2 is composed of core 12 of a standard epoxy-glass PCB (approximately 0.04-0.125" thick) with copper foil 10 (0.001-0.005 inch thick) laminate on one or more layers, as is common in PCB manufacture. In one method of forming integral contacts 3, the core material of the PCB is removed from the top side by routing, drilling and/or laser ablation down to the copper foil material on the bottom side, which is the module contact side, of the board, leaving the copper foil suspended adjacent to the cored structures 6. The cored structures may be routed or milled to a distance within approximately 0.005" of the copper foil, and subsequently any remaining core material removed by laser ablation, leaving the exposed copper foil. Note that it is not required that all insulating material be removed in order for the subject contact to function. Thus, a suspended integral contact is formed as a part of the PCB manufacturing process, and is integrally attached to the in-situ circuitry 11 on the PCB. The integral contacts may be formed at any point during the PCB manufacturing process, for example, using conventional routers, or may be formed as a secondary finishing process after the PCB is complete. Other features may be incorporated into the dielectric material and conductor pattern to tailor the mechanical properties of the contact system. For example, slits, and routed patterns to preferentially make locally separated or thinned regions of the substrate may be added to tailor compliancy of the contacts. Copper patterns may also be etched to control compliancy; for example slits or traces radiating out from a center conductor pad provide modified compliancy of the contact. Additionally, other materials may be added within the cored area to modify the contact properties, such metallic or organic coatings and films.

Secondary operations in the manufacturing process can also be used to create cavities for magnets and contact pads by attaching discrete contact pads that span through-holes in the substrate. The separate contact structures may be comprised of conductive metal foils, optionally formed before or after attachment, or structures formed into flexible printed circuit or other PCB materials. The separate contact structures are attached to the circuitry 11 of the substrate 2 by soldering, conductive adhesives, welding, or other means known in the art of electronic packaging.

Depending upon the thickness of the metal foil, shape of the cavity, and characteristics of the permanent magnet that will be placed in the cavity, the resulting integral contact may be relatively rigid or stiff. An overly stiff planar contact that is flush with the bottom of the module substrate may inhibit good contact to an external power source having planar contacts. It is desirable to have the integral contact project below the plane of the substrate 2. (The above referenced provisional and non-provisional patent applications describe flexible magnetic contact designs comprising contacts that are sufficiently compliant to create reliable electrical contacts with this geometry.) The metal conductor surfaces and contacts of the substrate may be plated with a variety of corrosion resistant materials such as nickel-gold, nickel-tin, etc.

Also, a non-planar contact is desirable for consistent electrical contact force and Hertzian stress considerations. Consequently an embossing or coining procedure may be used to produce a relatively non-compliant formed contact point that projects below the surface of the substrate. While relatively stiff contacts, i.e., contacts that do not change shape under the action of the magnet, may accommodate mechanical tolerances for the modules with two-contacts shown in FIG. 2, flexible contacts as described in the referenced patent applications are preferred when the module has more than 3 contacts. For example, an embossed spherical surface 6 in an integral contact of 0.250 diameter is easily produced in copper foils of 0.0014 inch thick, that project ~0.03 inches below the module substrate surface. Other parts may be bonded to the interior or exterior surfaces of the contact to provide similarly shaped contact points, but the aforementioned coining method is inexpensive. Another advantage of coring the substrate is that it minimizes the distance from the magnet to the ferromagnetic external circuit connection as described below.

Allowing the magnets 5 to freely move within the retaining feature, negates any need for orienting magnets during module assembly that have sufficient clearance to reorient in the cavity after assembly, avoids additional stresses on the metal foils of the integral contacts, and allows self-orienting of the magnets during use in the maximum magnetic flux and force direction. Spherical magnets, or other curved shaped surfaces of the magnets, or additional pieces attached to the magnets (such as ferromagnetic parts with spherical surfaces), provide good Hertz contact stress and minimal mechanical stress on the integral contact foils.

Such features as the lens, spacer ring, etc. described above are not required for the basic function of the integrated magnetic interconnects. The only basic components required are the substrate with integrated contact and magnet. For example, LED components may be a direct chip attached to the substrate with thermal vias for low thermal resistance, and protected with a dispensed encapsulant, with magnets either adhered to the integrated contact pads or mechanically retained with a separate part or feature.

Figure 6:
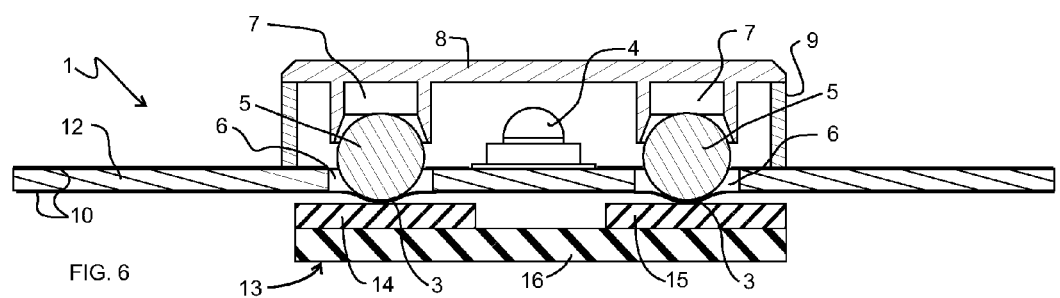
FIG. 6 is a section view of FIG. 5 of flat track electrode with MLM.

In operation, the module with integrated contacts is attached to a power source and/or other electronic interface circuitry; this source interface circuit includes ferromagnetic components to produce magnetic electrical contact force and mechanical retention. Referring to FIG. 5 and FIG. 6, in an example embodiment, lighting modules 1 are magnetically attached to a flat track 13 containing ferromagnetic electrode strips 14 (positive) and 15 (negative), separated by an insulator 16 connected to a low-voltage DC or AC power source 17. The magnets 5 are attracted to the ferromagnetic electrode strips 14 and 15, compressing the integral contacts 3 and establishing electrical interconnection and mechanical retention. FIG. 6 is a side cross-sectional view through module 1 and track 13. The module is readily repositioned at different positions on the track without a tool. Alternate flat track designs compatible with the magnetic lighting module may be comprised of non-ferromagnetic conducting strips such as copper foil attached to a ferromagnetic plate with adhesive. Electrode strips 14 and 15 may be economically made using steel strip (e.g. 0.01 to 0.04" thick), plated with metals such as copper with tin over nickel, gold flash over nickel, etc., to provide stable contact resistance. Electrical conductivity of steel electrode strips may be enhanced by electroplating with copper or another conducting material.

Another construction of a laminated track (not shown) comprises a thin flexible circuit, such as a polyester-backed flexible printed circuit with copper circuitry and dielectric base layer, i.e., a laminated "flexible flat cable" construction, laminated to a ferromagnetic backing. These thin flexible tracks may be coiled for efficient packaging, or produced in rigid or semi-rigid strips with couplings. The flat flexible track may also be constructed of a hardened tempered spring steel material to produce a deployable/retractable track (either self retracting like a tape measure or other constant force spring or retractable by winding). Other construction methods include stamped conductors mounted to insulators or combined with insert-molding processes.

Flat tracks may also be environmentally sealed. For example, the track electrodes may be covered with an insulating tape which is die cut to facilitate temporary removal of discrete sections of the tape to expose track contact points where placement of modules is desired (this would also allow safe higher-voltage installations). This tape may be attached with a pressure-sensitive adhesive or may comprise electrically-insulating plastic magnet material. A low compression gasket may be disposed around the integral contact area, such that when the module is attached to the track, the contact interface is sealed.

By coring the substrate or providing a through hole for the permanent magnet, the separation distance between the permanent magnet and the ferromagnetic mounting surface can be made smaller than the substrate thickness. This coring operation increases the magnetic force of attraction for a given magnet size and type. For example, the separation distance from the permanent magnet to the electrode ferromagnetic component may be made as small as the thickness of the contact metallurgy of the module. Even when insulating sheets such as polyimide, polyester, or adhesives typically used in flexible circuitry are added to support the contact metallurgy, this separation distance may be chosen to be on the order of a few tenths of one millimeter.

Spherical NIB (neodymium-iron-boron) magnets $3/16$ inch diameter produce approximately 1 lb of force through the integral contact when placed against a ferromagnetic surface. This is sufficient force to produce reliable electrical interconnections resulting from the magnet pinching the integral contact between the magnet and ferromagnetic surface, as well as adequate mechanical force to retain a variety of modular electronic designs without additional mechanical attachment. ¼ inch diameter magnets produce 1.6 pounds of force. Additional mechanical and magnetic elements may be added to increase the mounting force as desired for a particular application.

Figure 7:
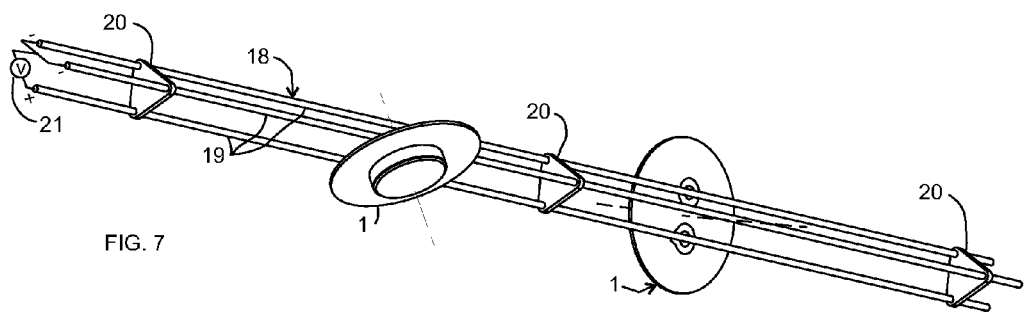
FIG. 7 is an isometric view of a triangular rod track electrode with MLM.

FIG. 7 illustrates another form of track comprised of discrete rods or wires. In the track 18 illustrated in FIG. 7, electrical and magnetic rails 19 are made from cylindrical or other cross sectional shapes of ferromagnetic wire or rod, separated and held in place by insulators 20. Ferromagnetic core wire or rod may be plated with materials such as copper, tin, nickel and gold to enhance electrical conductivity and provide low electrical contact resistance. Two or more rods are utilized for positive and negative power connections 21. As shown in FIG. 7, three rods allow modules 1 to be installed at any location along the rod track 18 at various different angular orientations corresponding to the planes formed by two adjacent rails. In this example with 3 rods, two different angular orientations are possible with two positive and one negative rail. If four rails are utilized in a square arrangement, with two common positive rails and two negative rails, modules 1 may be installed on any of the orthogonal sides. Modules 1 may be installed on the outside of any two rails, or on the inside (180 degrees opposite) of any two rails.

Figure 8:
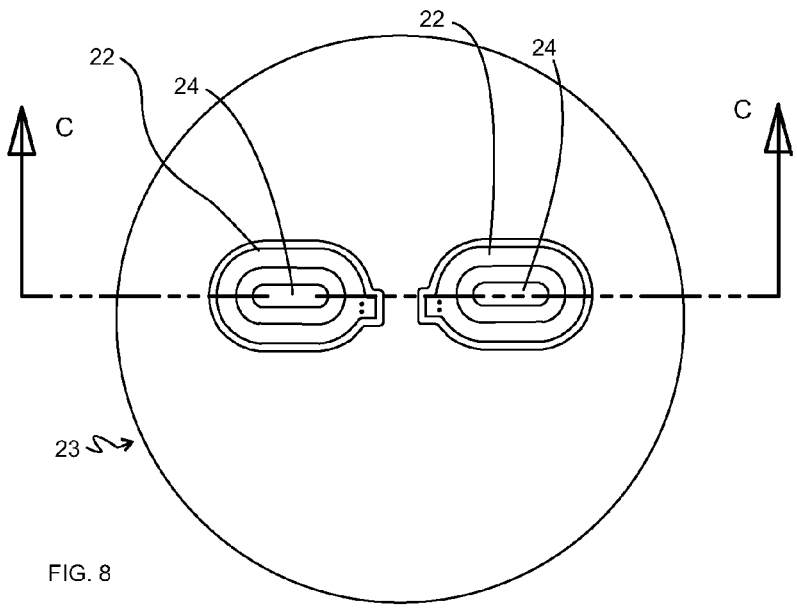
FIG. 8 is a bottom view of a module with elongated contacts.
Figure 9:
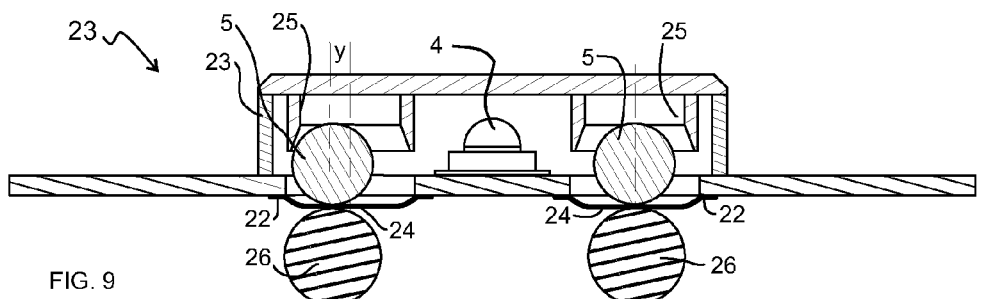
FIG. 9 is a section view of FIG. 8 (module and rod track).

To accommodate non-regular spacing and tolerance variations in the distance between the rails, elongated integral contacts 22 may be utilized as illustrated in FIG. 8 and FIG. 9. FIG. 8 is a bottom view of module 23 having elongated integral contacts 22, and FIG. 9 is a cross-section view of FIG. 8. The formed or coined contact area 24 of elongated integral contacts 22 is also elongated, in a direction that is substantially perpendicular to the axis of the rail when the modules are installed onto the track. One or more elongated contacts may be utilized in a module 23. Magnets 5 are loosely constrained in part by mechanical features 25 such that they are free to move within the elongated contact area. Consequently, when module 23 is brought into proximity to ferromagnetic rails 26, magnets 10 are attracted and automatically align to rails 26, thus allowing proper magnetic retention and electrical interconnection on non-uniformly spaced rails. FIG. 8 shows one of the magnets 5 displaced from its nominal center position by distance 'y'.

Figure 10:
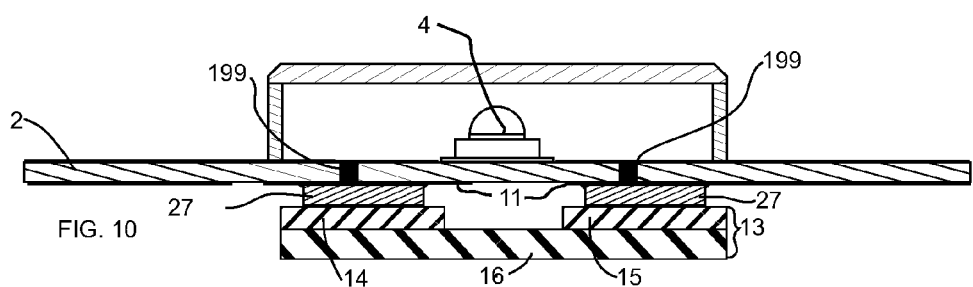
FIG. 10 is a module with permanent magnets attached to circuitry.

FIG. 10 illustrates a magnetic interconnection to a ferromagnetic flat track 13 (as previously described) using magnets 27 that are attached to the circuitry 11 of substrate 2. In this case, the magnets would preferably be coated with a material such as copper to make them electrically conductive, and a passivating plating such as nickel-tin. Magnets 27 are attached to the substrate circuitry by electrically conductive adhesives, soldering, etc. such that an electrically conductive joint is formed. Electrical signals may be routed to the top side of the substrate through plated vias 44. Conducting magnets 27 may also be attached mechanically and optionally electronically to the compliant flexible and cored contact structures described. As noted earlier herein the substrate can deform with substrate attachment of the magnets in order to be loosely constrained.

Figure 11:
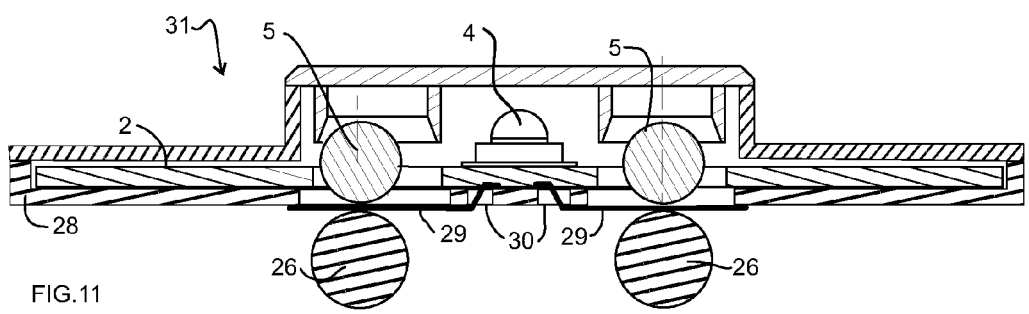
FIG. 11 is a module with auxiliary outer housing with contacts.

Referring to FIG. 11, other methods for forming magnetic integrated contacts include magnetic electrical contacts which are electrically connected to a circuit substrate 2 (such as a PCB or flex circuit), but may be attached to, or cooperate with, an additional intermediate part or housing 28. Contacts 29 may be routed through elongated openings, i.e. slots, 30 and disposed on the surface of housing 28. Contacts 29 may also be insert-molded into a polymer housing with pressure connection, or other methods such as soldering, to substrate 1. Substrate 1 and contacts 29 may also be integrated into a discrete flexible printed circuit, in which case contacts 29 are contained on the surface of the flexible circuit, and may be routed to the outer surface of module 31 by various means such as wrapping around the edges of housing 28 or through slots 30. For example, contacts 29 may be integrated onto a flexible printed circuit, and the flexible printed circuit, and any heat generating components thereon, attached to a housing 28 that is made of aluminum or other thermally conductive material.

Magnets 5 are located overlying contact pads 29 to generate direct contact force resulting from magnetic force generated between magnet 5 and a second element with a ferromagnetic component such as rails 26. When direct contact pressure between permanent magnets, contact structures, and secondary ferromagnetic elements is described in this disclosure, it is understood that permanent magnets 5 are not required to directly contact the electrical contact surfaces. Layers of substrate insulator material or housing material may also be disposed between the permanent magnet and contact surface; typically it would be preferable that such layers be relatively low thickness in order to maximize the magnetic contact force when in use. This intermediate layer between the permanent magnet and contact surface may also be shaped or formed to tailor the contact outer contact surface geometry.

A flexible circuit can be threaded through a slot in a substrate of solid construction that does not contain any electronic circuitry such as a metal plate and folded across a through hole and attached to a metal substrate as a lower-cost substrate alternative to the use of a metal clad printed circuit board. This is illustrated in FIG. 12-FIG. 17 described below. The use of metal substrates in which the LED modules are directly attached to the metal substrate with thermal conducting adhesive provides improved heat removal from the LED compared to thermal vias or enlarged circuit traces in a conventional FR4 printed circuit board of the same size.

Figure 12:
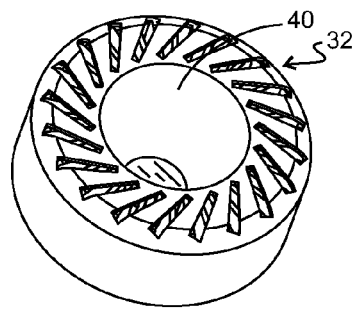
FIG. 12 is a top isometric view of a lighting module assembly with integral heat sink.
Figure 13:
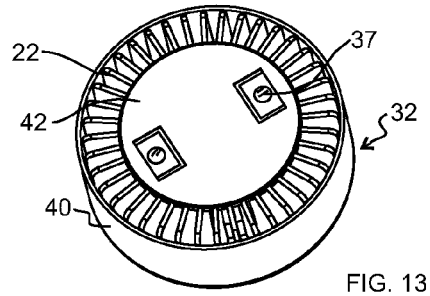
FIG. 13 is a bottom isometric view of a lighting module assembly.
Figure 14:
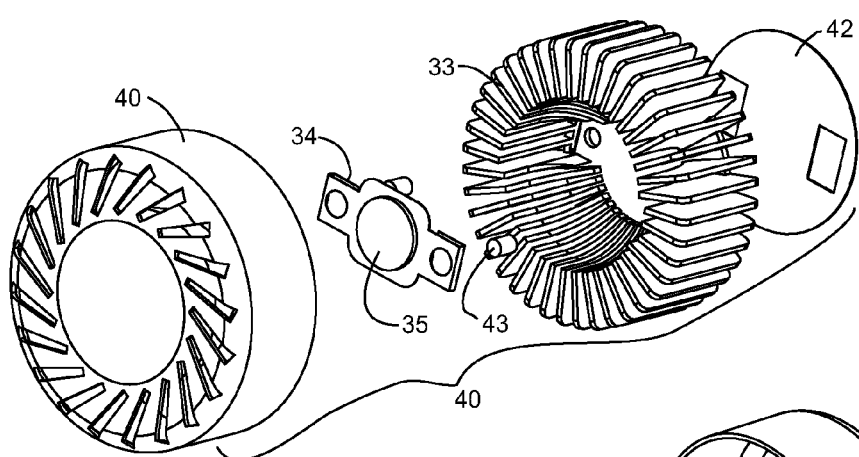
FIG. 14 is a top exploded isometric view of a lighting module assembly.
Figure 15:
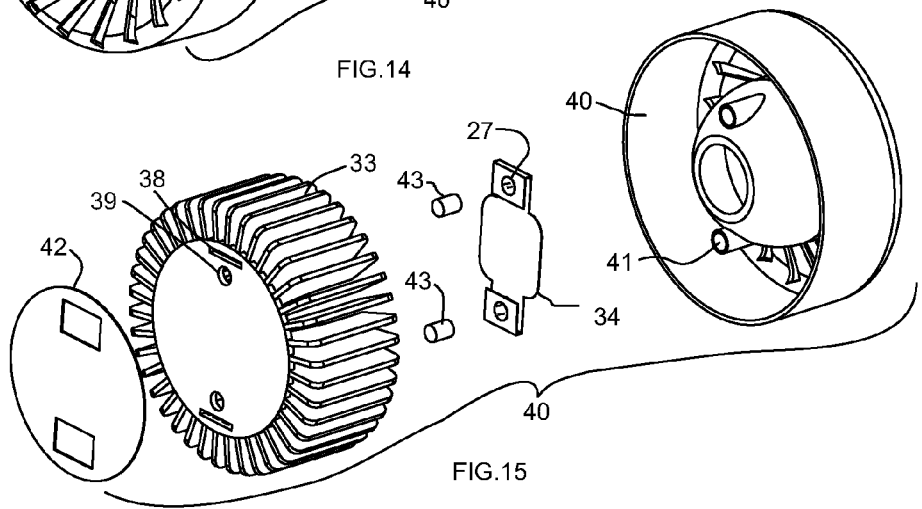
FIG. 15 is a bottom exploded isometric view of an integral heat sink with flexible assembly.
Figure 16:
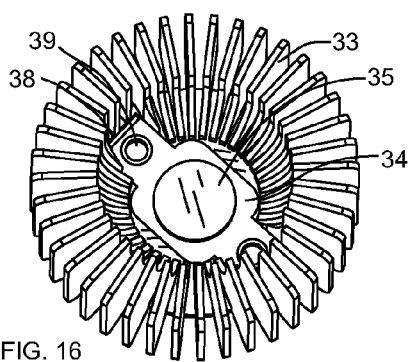
FIG. 16 is a top isometric view of an integral heat sink with flexible assembly.
Figure 17:
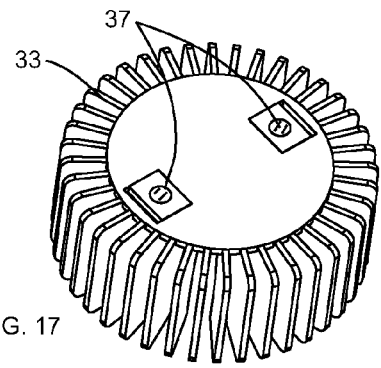
FIG. 17 is a bottom isometric view of an integral heat sink with flexible assembly.

FIG. 12 through FIG. 17 illustrates another embodiment of an integral heat sink lighting module 32. FIG. 12 and FIG. 13 are top and bottom isometric views, respectively, of heat sink lighting module 50. FIG. 14 and FIG. 15 are exploded top and bottom views respectively, and FIG. 16 and FIG. 17 are top and bottom isometric views of the heat sink base 33 with flexible printed circuit (FPC) 34 assembled. In this example heat sink lighting module 32 includes an integral heat sink base 33, made from cast aluminum, extruded aluminum or other thermally conductive materials. Although the planar base and finned heat sink 33 are shown as a single unit, these elements may comprise separate structures. The finned portion may not be necessary for lower power applications and may be eliminated. In this case, the unfinned heat sink base portion may be fabricated from a piece of sheet metal.

In this example embodiment, FPC 34 contains at least one LED 35 attached to the circuitry of FPC 34. FPC 34 may be attached to the surface of base 33 with thermally conductive adhesive to provide a low-resistance thermal path from the rear surface of LED 35. The FPC dielectric may be removed from under the LED to create an opening to connect the bottom surface of the LED subassembly to the metal base of the heat sink with thermally conductive adhesive to decrease thermal resistance. Alternatively, thermal vias and pads may be used on the FPC. As shown, the tabs of the FPC containing the FPC contacts 37 may be inserted into slots 38 in base 33, and folded underneath base 33 such that the conductive contact pads are adjacent to magnet openings 39. The FPC may be attached using adhesives or tape at the periphery around the contact pads 37. Lens/reflector 40 retaining features 41 overlying substrate through holes assist in loosely retaining magnets 43. Contacts 37 are compressed under magnetic force onto ferromagnetic tracks, or socket contacts, to effect electrical and mechanical connection as described previously. This example illustrates a single-piece housing 40 containing lens and reflector features, magnet retaining features and perforations for ventilation. The module back surface may contain a dielectric film or coating 42 to electrically insulate the surface, and/or provide a thermal interface function. This example may be utilized with the previously described tracks or may be incorporated into a socket.

Figure 18:
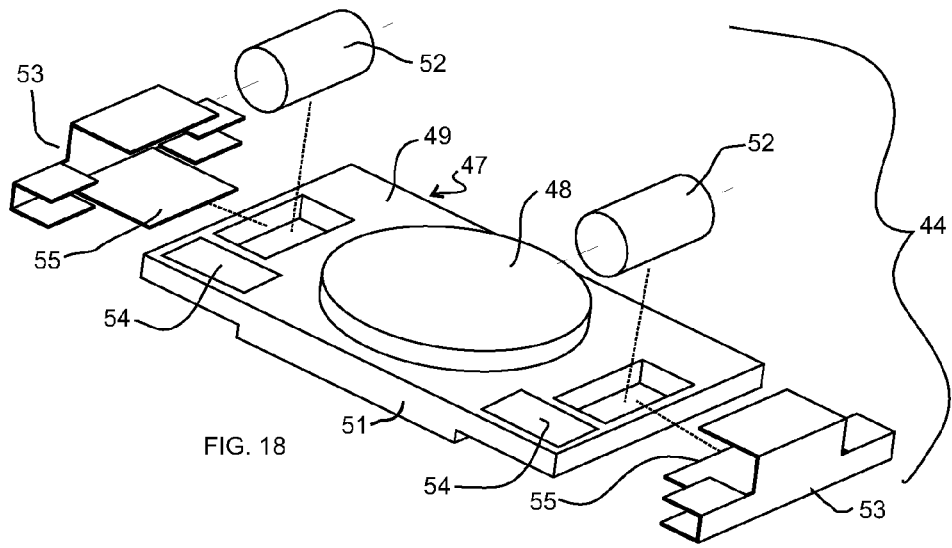
FIG. 18 is an exploded isometric view of a substrate level MLM.
Figure 19:
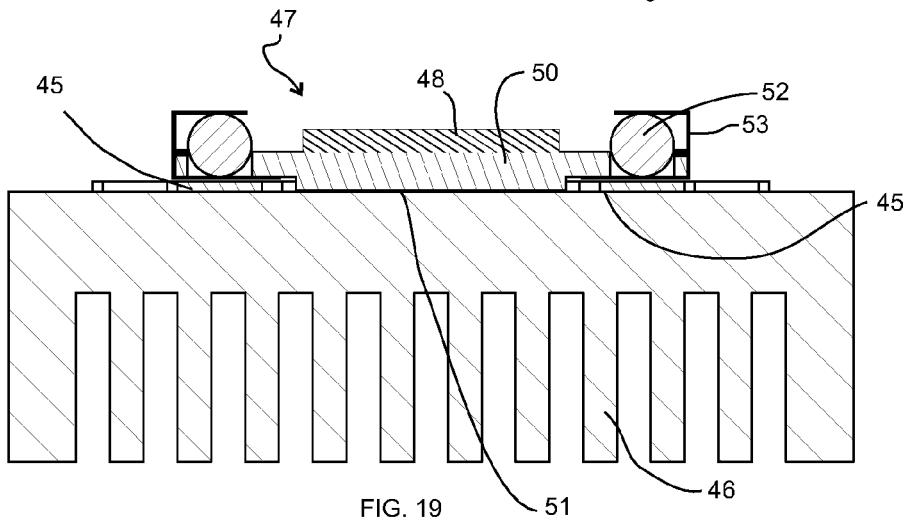
FIG. 19 is a section view of substrate level MLM on heat sink with rails.
Figure 20:
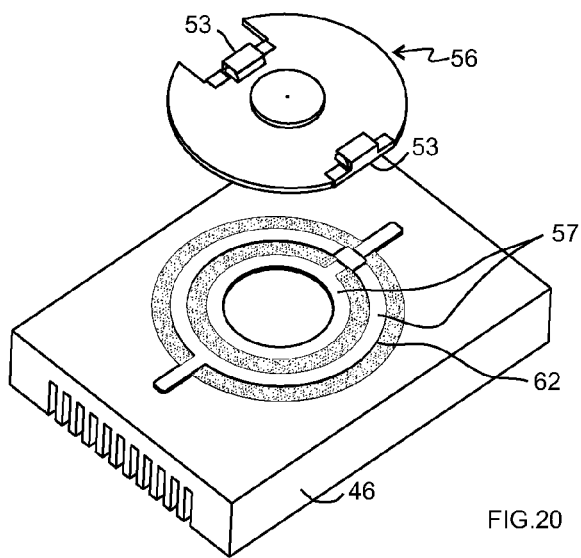
FIG. 20 is a view of concentric substrate MLM contact pads on heat sink.

An alternate embodiment of a magnetic lighting module employing LED subassemblies is shown in FIG. 18, FIG. 19 and FIG. 20. This type of construction is compatible with utilizing OEM "first level package" LED light engines where LEDs are provided by the manufacturer integrated onto a substrate such as a metal-core-pcb (MCPCB) or ceramic substrate. FIG. 18 is an exploded view and FIG. 19 is a cross-sectional view of an assembled substrate MLM 44, ferromagnetic flat track electrode 45 and heat sink 6. Substrate 47 may be constructed from a metal-core-printed-circuit-board (MCPCB), a flexible printed circuit attached to a metal substrate, a ceramic or other circuit board materials and combinations known in the art of electronic packaging. Generally substrate 47 would be constructed with one or more methods to provide improved thermal conductivity through the substrate to dissipate and transfer heat from LED light engine or subassembly comprising an array of LED die 48, whether by the substrate's bulk material properties (as in the case of an MCPCB's) or features such as thermal vias known to those skilled in PCB fabrication, and/or auxiliary heat spreaders, metal slugs or other inclusions, fluid-filled heat pipes, etc. In this example, substrate 47 may be a MCPCB, with top layer circuit 49, aluminum core 50, and a protruding pad 51 to allow the surface of pad 51 to be in contact with the surface of heat sink 46. Pad 51 may be replaced or supplemented with a discrete part attached to the substrate, heat sink or track, or a pad of thermally conductive compliant material. Substrate MLM 44 contains features to loosely retain and locate permanent magnets 52. In the subject example, magnets 52 are retained in a substrate opening by formed contact 53. These may be constructed of various materials such as copper alloys plated with nickel, tin and/or gold, or a flexible printed circuit. In a substrate containing only a single circuit layer on the top side of the substrate, the contacts are configured to make electrical contact with circuit pads 54, by spring force, soldering, conductive adhesives, etc. Contact 53 wraps around to the bottom side of substrate 47 and contains a contact area 55 that is electrically and mechanically connected to rail/track 45 by magnetic force between magnet 52 and the ferromagnetic component of rail/track 45.

Contacts 53 may be designed to provide a downward preloading force of pad 51 onto heat sink 46 by the configuration and offset of the substrate, track and contact dimensions. Contacts may be constructed in a variety of designs, such as the compliant contacts described in the referenced patent applications or conventional spring contact element designs and geometries. A thermal interface material such as thermally conductive tapes, pads and greases may be added at the interface between the substrate and the heat sink surface. When MLM 44 is attached to track 45, magnetic force is produced between the ferromagnetic component in track 45 and magnet 52, thereby compressing the bottom of contact 53 to the electrode rails of the track to affect electrical contact, and bringing the raised thermally conductive surface 51 in close proximity to, or mechanically forced through spring action against, heat sink 46, thereby affecting a thermal conduction path. The MLM is mechanically retained onto grid/track by magnetic attraction, although additional mechanical retention in the form of deflecting latches or threaded fasteners may also be employed. Substantially planar mechanical, electrical and thermal connections may also be made, without utilizing preloading with spring components; in this case the MLM would be designed such that the thermal interface maintains no significant separation, or a small controlled, gap (said gap filled with a thermal interface material) to the heat sink without designed-in preload. Multiple MLM's may be easily attached or removed from the track and reconfigured. Portions of the permanent magnets 52 may also be in contact with the track electrodes and/or the contacts 53, and thereby provide electrical conduction. Electrode rails may also be recessed into the heat sink surface which reduces the amount of required compliancy between the module and heat sink or height of the substrate protrusion. This is advantageous if relatively thick rails are required.

FIG. 20 illustrates a concentric substrate MLM 56 similar to the aforementioned example. Contacts 53 are offset at different distances from the center of MLM 56 to facilitate attachment to concentric circular electrodes 57. Construction of contacts 53 and corresponding concentric electrodes 57 may be similar to the aforementioned linear track/grid designs. Other methods of constructing electrode 57 include attachment of the conductors with ferromagnetic component to an underlying retaining sheet 61, such as a thermally conductive tape, that may be applied to heat sink 4 with pressure sensitive adhesive (PSA) using previously described attachment methods.

Other methods of constructing a power distribution track, grid and electrodes include the use of thin flexible circuit materials that are attached to a magnetic or ferromagnetic backing. The heat sink may also contain a ferromagnetic or magnetic component or be fabricated from a ferromagnetic or magnetic material. Electrode tracks, grids and pads may be attached to heat sinks with adhesives, tapes or other mechanical methods such as screws, rivets and barbs. An insulating layer is present between the rails and electrodes as needed. The heat sink may serve as an electrically conductive path.

For example, referring to FIG. 21, a thin PCB or flexible circuit 58, comprised of an electrically conductive layer with electrode traces 66 and dielectric layer 67 (e.g. polyester, polyimide, etc.) may be laminated to a relatively thin (0.005-0.03 inch thick) piece of steel 59, which then is subsequently attached to a larger heat sink 46 made from Al or Cu; the less-thermally conductive steel may be bonded to the more thermally conductive aluminum or copper of the heat sink body using thermally conductive adhesives or other cladding methods. These thin circuits, and the steel backing, may contain open areas in the circuit dielectric material to allow contact between the MLM heat-spreader/conductor 60 and base heat sink 46 material. The example lighting module 62 comprises contact pads 63, magnet 5, and substrate 64. Substrate 64 may be a conventional epoxy-glass construction, ceramic, or other substrates known to those skilled in the art; thermal vias 65 may be constructed to conduct heat to spreader/conductor pad 60 made from aluminum, copper, or other thermally conductive material and subsequently to heat sink. Substrate 64 may have a variety of circuitry and components such as LED's 4 and other control circuitry. The thin PCB or FPC dielectric may also contain thermally conductive fillers to enhance thermal conductivity; in this case, the thermal conduction path may be through the thermally conductive dielectric material. The close proximity of the magnetic materials at the electrical contact position provides higher mechanical force to pull the heat spreader/conductor pad 60 into intimate contact with the heat sink.

Such designs may be provided to a customer with the FPC circuitry laminated to a ferromagnetic backing, with the ability to easily separate and assemble modular sections and attach to heat sinks with adhesives or mechanical methods. Mechanical installation (screws, rivets, barbs, clips, etc), thermally conductive adhesives and tapes, and magnetic components are various methods of attachment of electrodes to heat sinks and heat-spreaders.

FIG. 22 and FIG. 23 illustrate another embodiment of a magnetic lighting module 68 and socket style base 69. Lighting module 68 includes electronic substrate 72 (e.g. metal core PCB) with LED area 70 and substrate contacts 71. Similar to previous descriptions, substrate 72 may be a MCPCB with LED die mounted directly on the substrate, or discretely packaged LED's mounted onto substrate 72. Contacts 73 may attach to the top-side electronic circuitry of substrate 72 and wrap around to the back side of substrate 72. Contacts 73 may be made of spring materials such as copper alloys, flexible printed circuit material, or other electrically conductive materials. Lens/reflector 74 may be affixed to substrate 72, and in the example illustrated has retaining features 75 to help loosely retain magnets 43. Lens/reflector assembly 74 may have a variety of reflector, lens and outer housing shapes, with orientation and locking features.

Socket 69 may include a locating socket base ring 76 with ferromagnetic contacts 77. Contacts 77 contain a ferromagnetic element (e.g. tin-plated steel) whereby magnets 43 are magnetically attracted to contacts 77, facilitating mechanical, electrical and thermal connection to heat sink 46. Socket 69 may be inexpensively made using injection insert-molding of the contacts and locating ring. Socket assembly 69 may be mounted to heat sink 46 with pressure sensitive adhesives, screws, or other adhesive and mechanical retention methods. If the surface of heat sink 46 is electrically conductive, an electrically insulating layer may be placed between contacts 77 and the surface of heat sink 46 for isolation. The interface between the bottom of substrate 72 and heat sink 46 may contain a thermal interface material such as a thermally a conductive pad 79, or thermal grease. Socket base 76 and lighting module 68 may contain other features such as mechanical orientation keys 80, mounting holes 81 and other mechanical retention features. Contacts 77 are provided with a termination feature 82 suitable for electrical connection to wires or electrical connectors. During installation, magnetic lighting module 68 is brought into proximity to socket assembly 69 and the magnetic contacts affect electrical, mechanical and thermal connection. For example, 0.19" diameter, 0.25 length neodymium-iron-boron magnets produce approximately two pounds (900 grams) of contact force for each magnet, and an LED lighting module approximately 1.75" diameter may be constructed as shown with a weight of approximately 25 grams. Thus, there is sufficient force to retain the lighting module and affect electrical and thermal contact.

The number and size of the magnets may also be varied to alter the retaining and contact forces; multiple electrical contacts and/or purely mechanical contacts and magnets may be incorporated into the base and lighting module. For example, FIG. 24 illustrates a socket 83 that has electrical contact springs 84, and ferromagnetic pads 85; lighting module 86 contains electrical contact pads 84 and magnets 88 within the lighting module 86. Thus, ferromagnetic pads 85 and magnets 88 have no electrical function, the magnets 88 and ferromagnetic pads 85 produce the force to compress electrical spring contacts 87 to contact pads 87, while simultaneously retaining the lighting module and producing thermal contact to heat sink 46. Mechanical spring contacts may also be similarly incorporated into the module. Since the spring contacts deform under the magnetic force, the magnets may be rigidly fixed in the module.

FIG. 25 illustrates a facetted heat sink 90 with multiple sockets 69 affixed thereon, and multiple lighting modules 68 installed into sockets 69. Wires 91 connect sockets 69 together or separately as appropriate for the electrical design of the lighting modules and power supply 92. A facetted linear heat sink as illustrated may be useful for various track-style lighting fixtures. Sockets and lighting modules may be installed onto any style of heat sink or heat spreader capable of dissipating the heat from the specified number of lighting modules, the goal being to keep the LED device temperature below the specified maximum operation junction temperature of the device. As an alternative to wires, the track systems described previously may be utilized with similar facetted heat sink components.

Figure 29:
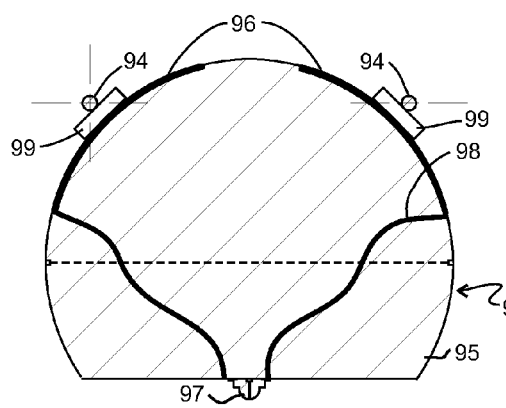
FIG. 29 is a vertical position of a section view of rotary lighting module.
Figure 30:
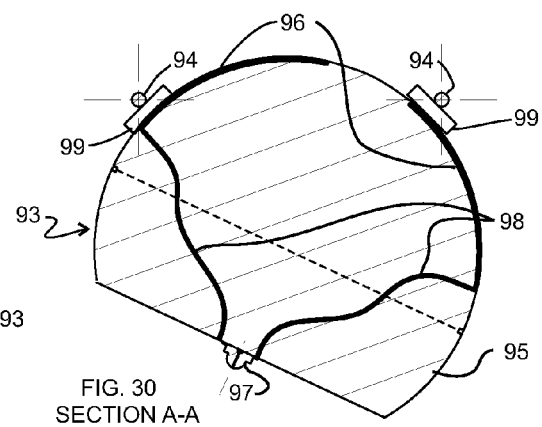
FIG. 30 is a rotated position of a section view of a rotary lighting module.

FIG. 26-FIG. 30 illustrate rotary magnetic lighting modules 93 that may be attached to and powered by ferromagnetic electrode rails 94. FIG. 26 is an isometric view of modules 93, FIG. 27 is a top view, and FIG. 28 is a side view of modules 93 and electrode rails 94. FIG. 29 and FIG. 30 are side sectional views of module 93 and electrode rails 94 illustrating pivoting of the modules. In this example, rotary module 93 may comprise a finned aluminum body 95 that contain spherical or compound-curved ferromagnetic contact pads 96. Ferromagnetic contact pads 96 are electrically connected to LED 97 (using wires 98, FPC's and/or other electrical connection means). Rotary module 93 may be constructed in multiple pieces (for example split vertically or horizontally) to facilitate fabrication by casting, and for containing required circuitry within the module; the module may be constructed of a combination of materials such as injection-molded parts and thermally conductive cast aluminum parts. Body 95 may also be made from a metal-plated polymer. Module 93 is electrically and mechanically attached to ferromagnetic track 94 utilizing contact magnets 99; contact magnets 99 may be of a variety of shapes (e.g. discs, spheres, 3-D shapes) and materials. Magnets 99 may be plated with materials such as nickel-tin or nickel-gold for good electrical conductivity and contact resistance. Contact magnets 99 may also be wrapped with a thin FPC, or other conductor material, whereby electrical conduction is through the applied conductor instead of through the magnet itself. Contact magnets may also be a variety of materials and shapes, including polymer over molded designs that incorporate the electrical conductors and other auxiliary mechanical retention functions. Modules 93 may be rotated along any axis while retaining electrical and thermal connections between the contact magnets 99 and the ferromagnetic electrode rails 94 and ferromagnetic contact pads 96. The contact magnets 99, contact pads 94 and rails 94 are free to move and rotate relative to each other, and cooperate to maintain constant contact. Although they are not mechanically retained in the module, contact magnets may include mechanical features to maintain their position relative to the rails as the module is rotated. The magnets may be preferentially retained on the rail or module when the module is separated from the rail by controlling the relative forces of magnetic attraction of the magnet to these two structures.

Figure 31:
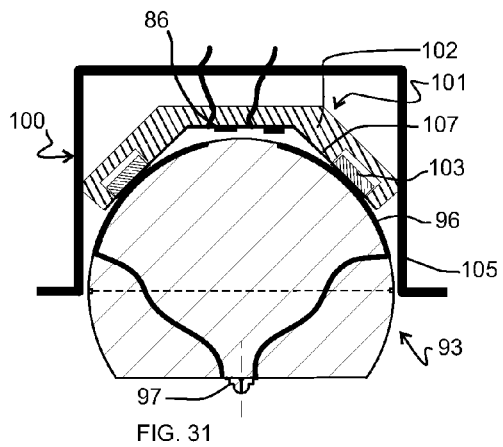
FIG. 31 is a section view of a vertical rotation of a rotary magnetic lighting module with can fixture.
Figure 32:
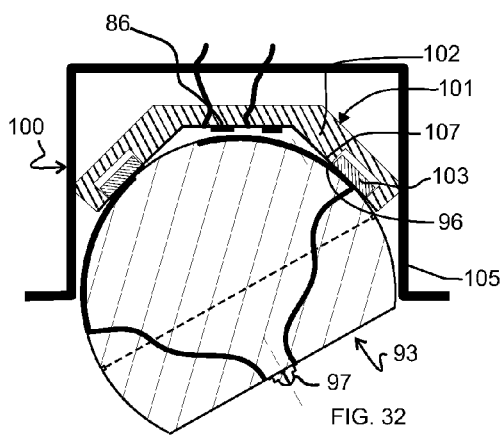
FIG. 32 is a section view of a rotary magnetic lighting module with can fixture in a rotated position.

FIG. 31 and FIG. 32 illustrate an embodiment of a can lighting fixture 100, into which the rotary magnetic lighting module 93 of the previous example may be installed to form a tilting/rotating recessed or semi-recessed lighting fixture. A fixture socket 101 comprises a housing 102, that loosely retains magnets 103, and a contact structure 104 in which electrical contact is made between the ferromagnetic contact pads 96. The contact structure of the socket may be comprised of contact pads formed in FPC 107 with passive and active electrical components 106 components and contact pads disposed on the FPC adjacent to the magnets 103. Electrical contacts may also be formed utilizing conductive sheet materials such as copper alloys. Socket 102 may be installed into a shell 105, similar to commercially available "can lights". FIG. 31 illustrates the lighting module 62 installed vertically, and FIG. 32 shows the lighting module tilted in the socket.

Figure 33:
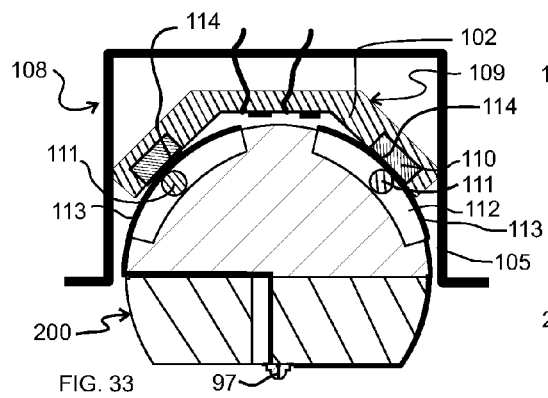
FIG. 33 is a section view of a rotary magnetic lighting module with movable captured magnetic actuators and can-type fixture.
Figure 34:
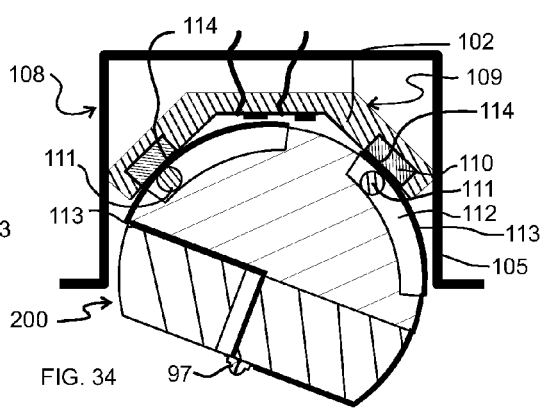
FIG. 34 is a section view of a rotary magnetic lighting module with movable captured magnetic actuators in a rotated position and can-type fixture.

FIG. 33 and FIG. 34 illustrate another embodiment of a rotary lighting module with movable captured magnetic contacts 200 installed in can lighting fixture 108. In this example, the socket 109 may contain either magnets or ferromagnetic components 110. Module magnetic components 111 are free to move within cavity 112, and thus when brought into proximity to a magnetic element 110 in the module, contacts 113 are compressed against the socket contacts 114 providing electrical contact and mechanical retention. Module magnetic components 111 may be many shapes such as spheres, and multiple magnets may be utilized in conjunction with multiple smaller cavities. Contact pads 113 may be formed from an FPC or thin sheet materials such as copper alloys; in this embodiment, the contacts are not required to be ferromagnetic. At least one side of the socket-module contact pair contains a permanent magnet; the other side of a mated contact may contain a ferromagnetic component or permanent magnet. Note that the lighting modules shown in FIG. 33 and FIG. 34 may also be attached to the rail electrode assemblies previously described.

In the embodiments above, the LED light engine may be built directly into a higher level module during the manufacturing of the module. There are many choices in LED light engines with respect to electrical supply requirements, optical power and spectral characteristics, directionality and uniformity of the light output, etc. These options create a very large number of possible combinations. Although the LEDs are efficient in their spectral output compared to incandescent lamps, they do generate waste heat that must be removed from the LED. As a result, there are also a number of different heat sinking requirements for light engines using different LED modules and outputs. Although there is some flexibility in the application of external heat sinks in the embodiments above, there are a number of interfaces in the heat conduction to the external heat sink.

Embodiments described below provide an alternate approach suited for higher performance, higher power lighting modules. Since higher performance generally results from using higher cost components, greater flexibility and modularity may provide significant savings by allowing customization closer to the end use location.

Figures 35, 36:
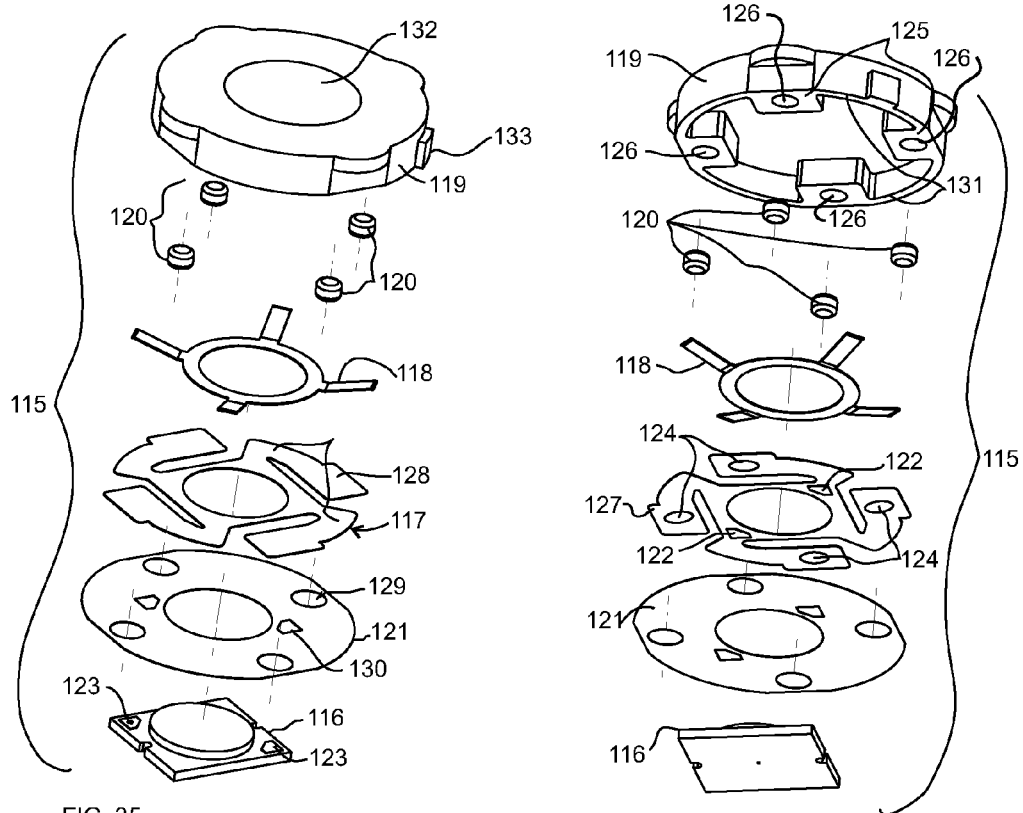
FIG. 35 is a top exploded view of compliant thermal MLM.
FIG. 36 is a bottom exploded view of compliant thermal MLM.
Figure 37:
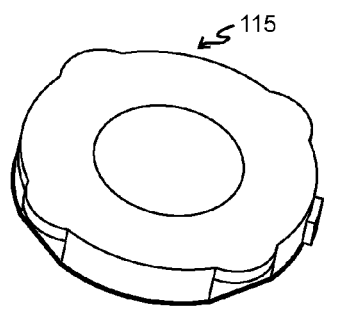
FIG. 37 is a top isometric view of a compliant thermal MLM assembly.
Figure 38:
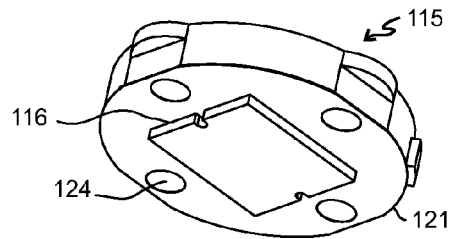
FIG. 38 is a bottom isometric view of a compliant thermal MLM.

FIG. 35 through FIG. 38 illustrate another embodiment which provides modularity and thermal management with higher efficiency due to fewer interfaces between the LED element and the external heat sink. FIG. 35 is a top exploded isometric view of compliant thermal modular lighting module 115; FIG. 36 is a bottom exploded isometric view; FIG. 37 and FIG. 38 are a top isometric view and bottom isometric view, respectively, of compliant thermal MLM 115.

MLM 115 is comprised of an LED subassembly 116, flexible conductor assembly 117, stamped spring 118, housing 119, and permanent magnets 120 and may optionally include flexible protective film 121. The LED subassembly 116 may include an array of one or more semiconductor chips on a common substrate or may be an extended OLED. In this example, flexible conductor 117 may be a flexible printed circuit (FPC) such as copper-clad polyester or polyimide common in the PCB industry. Flexible circuit 117 contains inner lead bond pads 122 that are electrically attached to the respective LED bond pads 123 of LED 116. Shown in this illustration are four radial contacts 124, at least two of which would be electrically connected to LED pads 123 with circuitry on the flexible circuit 117 for supply of power to operate LED subassembly 116. The additional contact positions may be used for other functions such as dimming, color control, etc., or may be used only for mechanical retention purposes. Many different form-factors and contact geometries of the module are possible using the inventive concepts included in this disclosure.

Inner lead bond pads 122 of the FPC may be electrically attached to LED subassembly bond pads 123 by soldering, conductive adhesives/films or pressure connections. Flexible circuit 117 may be attached (with adhesives, insert-molding, etc.) to housing 119 on housing surfaces 125, covering magnet pockets 126 and retaining magnets 120. FPC module contacts 124 are positioned over pockets 126. FIG. 44 shows a detailed view of the stack up of the aforementioned structure). The flex circuit surfaces 127 are preferably attached to the corresponding housing surfaces 125 surrounding the magnet pockets 126; other parts of the flexible circuit 117 are loosely constrained, so that the flexible circuit is free to move to allow relative movement of the parts, to provide compliancy for the thermal interface (described below) and to provide compensation for initial mechanical tolerances and differential thermal expansion effects during operation. In this example, FPC arms 128 are free-floating and configured to allow axial displacement of the LED subassembly 116, flexible circuit 117, spring 118, and protective film 121. Protective film 121 contains contact pad openings 129 and bond pad openings 130 and thus may be assembled between the top surface of LED 116 and bottom surface of flexible circuit 117, and to the perimeter 131 of housing 119, and surfaces of FPC adjacent to contacts 124, with adhesives such as pressure sensitive adhesives, to form a completely sealed structure. Other components and circuitry may be added to FPC 117 to perform functions such as power conditioning, dimming, etc.

Housing 119 may be injection molded from transparent materials such as acrylic or polycarbonate and may contain features such as lens structures 132 to modify the direction, distribution or spectral content of the emitted light and keying features 133 to control mating orientation.

Protective film 121 seals the interior of the module 115, but is not required for the lighting functionality of the module. In addition, the LED and optics may be sealed around the perimeter of the LED with a foam or elastomer gasket or other sealant to increase environmental isolation.

FIG. 37 and FIG. 38 shows a top and bottom assembled view, respectively, of module 115. As illustrated, the bottom side of the LED subassembly 116 substrate is fully exposed on the bottom side of the module. Although full-exposure may be optimum for providing the largest thermal path to the heat sink, the LED subassembly may alternatively be mounted on the top side of the flexible circuitry. In this case, an opening may be cut out of the flexible circuitry or thermal conduction enhancements such as thermal vias through the flexible circuitry may be used to increase thermal transfer to the heat sink from the bottom of the LED assembly. Having the bottom of the LED subassembly exposed through an opening in the FPC or other substrates reduces the number of thermal interfaces between the LED subassembly and the heat sink. In these examples, it is not necessary to conduct heat from the LED subassembly through an electrical or mechanical substrate or through a magnetic material, as is required in other prior art designs. Since the magnets and circuit substrate connected to the LED assembly are not located in the thermal path from the substrate to heat sink, thermal properties of the magnets and circuit substrate are not critical.

Figure 39:
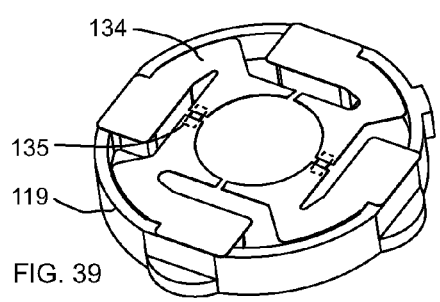
FIG. 39 is a module with housing and stamped sheet metal circuitry.

As described in earlier embodiments, the substrate of the module may consist of various materials such as epoxy glass printed circuit boards, ceramic substrates, metal-core PCBs, rigid-flex PCBs, molded circuit substrates, insert-molded metal and polymer assemblies, or other electronic substrate materials known in the electronic packaging arts. The substrate material underlying the LED subassembly may be removed to reduce the thermal interfaces between the back of the LED subassembly and the heat sink. FPC 117 may also be replaced with a continuous metal foil (e.g. non-magnetic materials such as copper, phosphor bronze) or a metal stamping if minimal circuit complexity is required. For example, referring to FIG. 39, a segmented stamped metal foil 134 is attached to housing 119. Each segment may be electrically separated from other segments or may be connected to other segments to form electrical circuits through the addition of components 134 (such as resistors, diodes, etc.) between the foil segments. Such structures may be insert-molded into housing 119, or attached with mechanical or adhesive methods. The LED subassembly may be attached to the top or bottom side of the metal segments. A flexible protective film may be added to this assembly. Attachment of the LED to the metal foil 134 may be through soldering, conductive adhesives or pressure connection.

Figure 40:
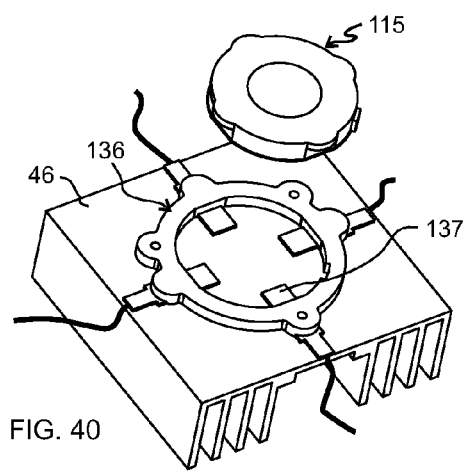
FIG. 40 is an exploded view of thermal MLM, low profile socket and heat sink.

Referring to FIG. 40, the electrical, thermal and mechanical connection of module 115 onto an external heat sink 46 is accomplished by installation onto ferromagnetic contacts 137 of socket 136, or the rail and socket electrodes described previously. Although 4 magnets associated with 4 electrical contacts are shown, some magnet and ferromagnetic pad pairs may be used to provide higher magnetic forces without participating in electrical conduction.

Referring to FIG. 41 through FIG. 44, the electrical, mechanical and thermal connection of module 115 to heat sink 46 and socket 136 is illustrated. FIG. 41 is a top view of module 115, socket 136 and heat sink 46. FIG. 42 is a cross-sectional view of module 115 prior to installation into socket 136 and FIG. 43 is a cross-sectional view of module 115 assembled to socket 136 and heat sink 46; FIG. 44 is a detail view of the electrical contact area. Spring 118 is designed such that when module 115 is seated onto the ferromagnetic contacts 137, spring 118 is compressed to provide a compressive load between the base of LED 116 and heat sink 46, the force generated by magnets 120 being attracted to ferromagnetic pads 137, while magnets 120 simultaneously provide contact force between FPC contacts 124 and socket contacts 137. Portions of the flexible circuit, and the optional protective film 121, may be configured to provide the desired amount of movement and flexing of the LED and flexible conductor assembly to meet design objectives. Magnetic attractive force between magnets 120 and ferromagnetic pads 137 pulls the LED 116 substrate towards the heat sink, compresses spring 118, and provides electrical contact and mechanical retention forces through contact pads 1248 and 137. Thus, the module LED subassembly 116 is compressively loaded against heat sink 46 to provide thermal heat sinking at the same time that the module is also electrically connected and mechanically retained to the heat sink. The back surface of LED 116 may have a resilient or compliant thermal interface material 138, such as a thermally conductive pad, phase-change material, grease, etc., to enhance thermal conductivity through the interface to the heat sink. The thermal interface material may optionally provide a compressive spring or compliant force instead of, or in addition to, a formed spring member. A boss or other raised area may also be included in the surface of the heat sink to increase compressive loading. The use of magnetic attraction and the compliant mounting of the LED subassembly compensates for mechanical mismatches between elements for both electrical and thermal contact surfaces, and to reliably and predictably retain required thermal connection of the LED to heat sink over the life of the product, in one embodiment, even if the magnets are not loosely constrained.

In the example embodiments illustrated in FIG. 35-FIG. 44, having an exposed external heat sink in thermal contact to the bottom of the LED subassembly, the magnets are located symmetrically outboard of the LED subassembly. This relative placement may provide more uniform compression of an elastic thermal pad within the thermal contact interface. If compliant materials such as thermal grease are used, this relative placement of magnets may not be a design consideration and asymmetric configurations and placement of magnets may be suitable. The range of mechanical tolerances and thermal expansion effects may affect design choices of preloading, stiffness and inelastic deformation effects in the contact pads and the electronic substrate used. A conventional "rigid" substrate such as epoxy-glass printed circuit board (PCB), MCPCB, or molded circuit device that has been provided with relief grooves or cuts, or specifically shaped beam spring configurations may be sufficiently compliant to provide thermal contact with the heat sink.

Functional prototypes of the designs shown in FIG. 35-FIG. 44 were constructed using four cylindrical NIB grade N52 magnets, 0.0875 diameter×0.0875" height, with a 0.007" thick FPC, and housing diameter of 2", and 0.375×0.375" steel socket contact pads. Each magnet produces about 1.3 pounds of retention force to each of the four contact pads with no spring present. A stamped spring was constructed to provide about 3 pounds of compression load when fully seated into the socket. Consequently, each of the four contact positions has 1.3-0.75 lb=0.55 lb/contact and retention force. The total weight of the module is less that 0.045 lb; thus 0.55 lb of force from each magnet is more than sufficient to produce excellent electrical contact and mechanical retention of the lightweight module. Spring forces, the number and size of magnets and contacts may be easily varied for a given application.

These prototypes were compared to a commercially available modular lighting product ("Helieon" from Molex, Inc.). The Helieon product contains an LED light engine that is mechanically mounted to a heat sink by a coarse screw thread and springs. The Helieon product requires a socket assembly to be bolted to a heat sink, to which the replaceable LED module is installed with a twisting motion. The designs herein were tested and compared to the thermal performance and other factors. Using the same LED light engines (Bridgelux 800 lumen), power supplies and heat sink for comparison, the thermal performance of the designs described herein was the same as, or better (depending upon thermal interface materials used) as the Helieon product, while reducing the number of lighting module parts to one third, and reducing the size, volume and weight dramatically. In prototype tests, thermal performance did not change appreciably with the attachment to a linear track system on the socket heat sink that did not provide ferromagnetic contact pads for two of the four magnets. This indicates that two magnets were sufficient to provide an efficient thermal conduction path from the light engine to the heat sink.

Utilizing a foil/sheet stamping to provide the compressive spring force may also eliminate separate springs. For example, a spring similar to the stamped foil 134 of FIG. 39 may be made from a non-magnetic spring material such as tin-plated phosphor bronze, which provides the spring force to compressively load the LED against the heat sink surface and provide electrical conduction. Required preloading and compliancy of the LED thermal interface to the heat sink is thus accomplished with a variety of methods including spring function and features which are incorporated directly into the electronic substrate (PCB, FPC, molded interconnect, insert-molded metals, etc), separate non-electrically conducting springs made from metals, elastomeric polymer springs, compliant elastomeric thermal interface materials, or combinations of the aforementioned.

Figure 45:
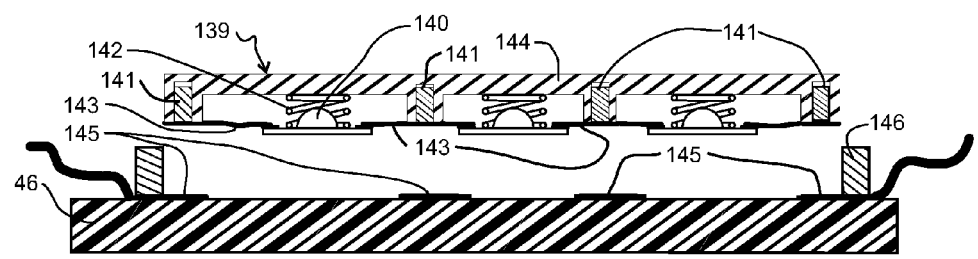
FIG. 45 is a multiple LED array module prior to installation in socket.
Figure 46:
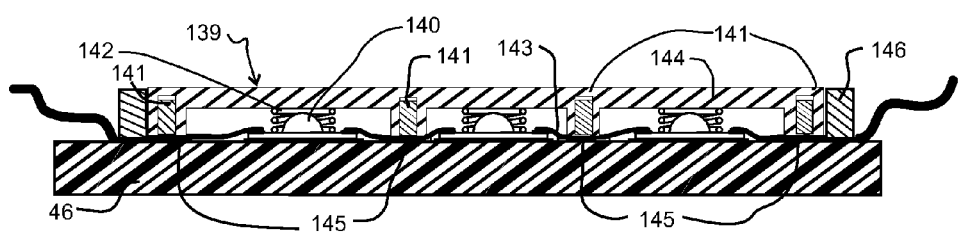
FIG. 46 is a multiple LED array module installed in socket.

FIG. 45 and FIG. 46 illustrate an LED module 139 comprising multiple LED components 140, multiple magnets 141, compression springs 142, compliant circuit 143 housing 144 and socket 146 with ferromagnetic pads 145 and heat sink 46. FIG. 45 shows module 139 uninstalled, and FIG. 46 shows module 139 thermally, electrically and mechanically attached to socket 146 and heat sink 46. The function of the elements of this multiple LED module is similar to that described above, except that the module contains multiple LED subassemblies. As described previously, springs may also be stamped single or "sheet" configurations, elastomeric springs, etc. Permanent magnets may be a variety of positions and sizes, and may be utilized for electrical, and/or compression for thermal contact or mechanical retention of the module. Large arrays may be constructed with uniform forces on the electrical contacts and thermal interfaces using this approach, since compressive and contact forces are provided locally by magnetic attraction of loosely constrained magnetic structures, and consequently close tolerances and rigid planar mechanical structures in the module are not required. This structure accommodates attachment to irregular surfaces, and similar designs may also be made to conform to non-planar surfaces by making the housing structure flexible or shaped to match a non-planar heat sink shape.

Although the embodiments above include an LED subassembly with a bottom surface which is electrically insulated and is used for mechanical support and thermal conduction, the bottom side of the LED substrate may optionally include areas for electrical conduction to the heat sink or to the socket. In this case, the use of graphite or other electrically and thermally conducting materials may be used to assist with thermal and electrical efficiencies. In addition to LEDs, other electroluminescent lighting components modules that require thermal conduction separated from electrical interconnection may benefit from the embodiments described here.

Figure 47:
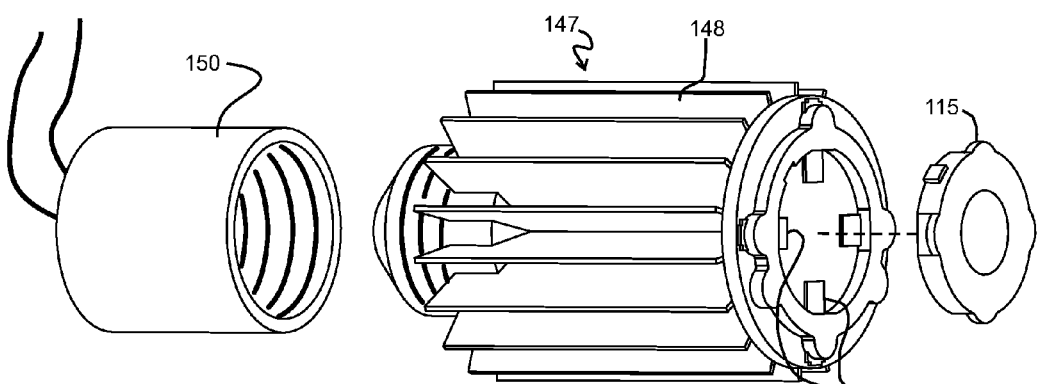
FIG. 47 is a module incorporated into conventional incandescent screw-in fixture.

The use of extended electrode rails that are not electrically insulated are suitable to lower voltage applications due to the exposed electrical supply voltage. The sockets that are described above can be designed such that they may be used with higher voltages as safely as a conventional mains supply Edison-type screw socket. Although heat sinks that provide support for electrical wiring have been illustrated, the small size and thermal efficiency of the current embodiment provides a method for making an LED replacement for conventional incandescent bulb screw sockets 150. This is illustrated in FIG. 47. The lamp replacement fixture 147 comprises a heat sink 148 with conventional screw base compatible with socket 150, power conversion and other electronics are incorporated within the base and/or heatsink structures. The module contains suitable ferromagnetic contact pad structures 149, connected to the electronics within fixture 147 as described previously to function with MLM 115. The electronics convert the AC mains signal to a safer lower voltage AC or DC drive signal for the LEDs in the lighting module. Ferromagnetic contacts 149 on the top side of the heat sink of this screw base assembly provide magnetic attraction to the magnets in the lighting module 115 as previously described. Even when mains power is applied to the screw socket, the MLM can be designed to require only low voltage is available on the heat sink magnetic socket assembly contacts. Bringing the lighting module in proximity to the socket assembly results in the mechanical, thermal and electrical connection as described above. The lens assembly may be shaped like a conventional bulb and may include phosphor or other materials or features that change the spectral content or directionality of light. Compared to conventional one-piece implementations of replacement bulbs, the heat sink electronics assembly 147 and the LED module can be individually replaced. The electrolytic capacitors that are commonly found in the electronics that convert from AC mains to LED drive voltages have a limited lifetime compared to LEDs and other solid state devices. The LED subassemblies are generally more expensive than the drive electronics. When something fails in the electronics of the heat sink assembly of this embodiment, it is not necessary to throw out the LED light engine that is part of the separate magnetic lighting module. In addition, LED magnetic lighting modules can be readily changed without tools to change the color or other characteristic of the emitted light without unscrewing the base from the screw socket fixture. While a two-piece configuration is shown in this figure, the heat sink, screw socket and electronics portion may be separated into more replaceable parts or may provide mounting contacts for multiple magnetic lighting modules.

The lighting module designs described in the above embodiments can be configured for use with an extended wiring grid while retaining their simultaneous mechanical, electrical and thermal attachment. The power distribution flexibility and modular thermal heat sinking of this grid provides more flexibility in positioning and thermal design than the linear track, rail and socket electrode embodiments above.

FIG. 48 and FIG. 49 show an embodiment of an electrode grid 151 constructed of a top electrode 152 containing openings 153, a center electrode 154 of opposite electrical polarity from top electrode 152, and a bottom electrode 155 (bottom electrode 155 facilitates attachment of devices to both front and back sides of grid 151, although it is apparent that a grid may be constructed with only two electrode layers). In an embodiment, one or more of the electrodes contains a magnetic component; for example center electrode 154 may be made from tin-plated steel sheet, and electrodes 2 and 4 from plated aluminum. Aluminum, copper and steel (used for the ferromagnetic component in the grid) are examples of materials that electrodes may be fabricated from; additionally platings and claddings of various material combinations may be utilized to tailor electrical conductivity, contact resistance, and corrosion resistance and thermal conductivity. For example, aluminum and steel may be plated with copper and tin to provide a suitable electrical contact surface, and increase electrical and thermal conductivity in the case of steel materials. There are many stack ups and material types and thickness that may be utilized.

For example, all electrodes of the grid may be constructed of a ferromagnetic material (e.g. tin-plated steel), or electrode layers may be a combination of ferromagnetic and non-magnetic materials such as steel, copper and aluminum. The electrode layer interfaces may be electrically insulated from each other by using dielectric films, spacers, adhesives, and/or surface coatings or treatments such as anodization. Areas adjacent to openings 153 in the underlying electrode are free from dielectric material to facilitate electrical contact to the electrode surface to create an array of recessed electrical contacts. As illustrated, top and bottom electrodes 152 and 155 may both be connected to the negative side of a power source 156 and the center electrode layer connected to the positive side of the power source. If desired, one or both of these outer electrodes may be tied to electrical ground or a third voltage level.

As an alternative embodiment (not shown) similar to FIG. 49, layer 152 may be a positive electrode and layer 155 may be a negative electrode. Layer 154 in this case would be an electrically insulating layer with perforations. If the openings of layers 152 and 155 are offset from one another, then when viewing the stack from the layer 152 side, the inner side of layer 155 would be accessible through openings 153, and vice versa. As a result of the asymmetry in the electrodes of the grid for DC voltages, modules may be designed that would function on a specific side even if the holes in the outer grids were the same size.

A benefit of this general design is that an outer surface of the grid that is exposed to a user may be designed to not contain a voltage potential difference on the surface or relative to electrical ground. The size, shape and aspect ratio of openings 153 may be configured such that the center electrode is not readily easily contacted except with an appropriately configured mating electrical device; this provides a further level of electrical isolation of the exposed surface of the top grid, and consequently the grid may be constructed for higher-voltage use (e.g. greater than 24 volts by some safety standards), while providing reduced risk of accidental human contact.

Yet another advantage of the grid construction is that the relatively large surface area and thickness of the conductor layers are suitable for carrying larger electrical currents if needed. Another object of the grid structure is to provide an efficient heat-sink or heat-spreading function to attached devices and/or thermal transfer to attached modular heat sinks. Materials and their thicknesses can be selected to provide heat transfer both in the plane of the grid or perpendicular to the grid.

FIG. 50 and FIG. 51 illustrate an embodiment of a grid using a selectively shaped inner grid electrode 156. The inner electrodes may be constructed with various shaped discrete ferromagnetic pads 157 to tailor a degree of preferential orientation and alignment of a module that is placed on the surface of outer (non-magnetic) electrodes 158 through local magnetic attraction differences. The selectively shaped grid 156 contains an array of discretely shaped magnetic areas, joined by electrically conductive members 159. In this example a punched sheet of conductive ferromagnetic material, such as tin-plated steel, contains circular pad areas 157 mechanically and electrically joined together with smaller connecting members 159. When a magnetic module is placed on the outer electrode 158 of the completed grid structure 160 (exploded view shown in FIG. 51), the module will be preferentially attracted to the underlying shaped magnetic inner electrode pads 157. Electrode layers 158, 156 and 161 are separated by a dielectric insulator (not shown) when assembled.

FIG. 52 through FIG. 55 shows an embodiment that demonstrates the function of the grid system and electrical, mechanical and thermal attachment of components thereto. In this example an LED grid lighting module 162 is illustrated. FIG. 52 is bottom isometric view of the lighting module. The general construction of the grid lighting module may be similar to the aforementioned lighting modules with compliant thermal mounting of the LED subassembly within the module. FIG. 53 is a cross-sectional view of grid lighting module 162, that is mechanically, electrically and thermally attached via magnetic force to one side of grid 151 and including an auxiliary heat sink 163 magnetically attached to the opposite side of grid 151. FIG. 55 is a schematic view showing examples of the varied locations possible for placement of module 162, schematically shown in FIG. 54, onto grid 151.

Referring to FIG. 52 and FIG. 53, the difference in this lighting module from previous embodiments is that at least one contact is a protruding contact 164. Substantially planar contact 168 and auxiliary magnets 166 are similar to module designs described previously. As shown, contact 164 may be "floating", in the sense that it is loosely constrained within module 162 and has the ability to move at least perpendicular to the grid to affect electrical contact to the inner electrode. Protruding contact 164 may be constructed from a permanent magnet with an electrically conductive coating, or a non-conducting magnet, which causes a separate associated metal contact to move. Non-floating or substantially rigid, protruding contacts and rigid planar contacts may be used, but will be less accepting of mechanical tolerance effects. For this reason, at least one of the magnetic structures should preferably be loosely constrained so that it can move at a minimum in a direction perpendicular to the grid. Protruding contact 164 is designed such that the contact will fit into openings 153 to contact only the inner electrode 154, while remaining insulated from the top grid surface. One or more layers of the grid 151 contain a ferromagnetic component. For purposes of discussion grid 151 is comprised of a center steel core electrode 154 (which may be plated or clad with materials such as copper and tin), and aluminum top and bottom surface electrode 152 and 155 (which may be plated or clad with materials such as tin or copper), with a dielectric layer 167 separating the center electrode 154 from outer electrodes 152 and 155.

The example of FIG. 53 shows the protruding contact 164 with an insulating layer or feature 165 disposed adjacent to the contact 164 to prevent electrical contact to the vertical edges of openings 153 in top outer electrode 152. However, it is understood that other methods such as providing an insulating layer (anodizing, thermally conductive adhesives, polymers, paints, films) on the vertical edges of openings 153 may also be used. Module 162 is attached to grid 151 using permanent magnets 166 that are attracted to ferromagnetic core electrode 154. Planar contact 168 may be substantially flat, i.e. lacking any feature that could extend through openings 153. Protruding contact 164 may be inserted into any grid opening 153, thereby contacting the center electrode 154, and planar contact 168 contacts any exposed area of the top electrode 152, thus establishing a positive and negative connection to the LED 116 through circuitry 169. Contacts 164 and 168 may be directly actuated with magnetic force from magnets 170 using magnets 170 substantially adjacent to the contacts that are movable within housing 172, or the contacts may be indirectly actuated with peripheral magnets such as auxiliary magnets 166—i.e. the protruding contact may be forced into contact with the recessed contact of the inner electrode by magnetic force applied from another structure located remotely from the contact location. Many contact designs are possible for the protruding contact, such as stamped and formed springs, pogo pins, conduction through magnets, flexible printed circuits, molded-interconnect-device features, etc. Planar contacts 168 may be constructed of a variety of techniques and methods similar to those described in the references and in this document. A thermal interface material such as a thermal pad or grease may be disposed between the LED 116 and grid 151, and may also serve as a compliant interface material. Grid electrode layers may also be constructed from flexible printed circuits, thin PCB's and stamped circuitry.

The magnetic force may be designed to be sufficient to provide mechanical, electrical and thermal connection of LED module 162 to grid 151. Magnet sizes, shapes separation distances and material properties are readily varied to provide desired forces and properties. Grid 151 may have significant thermal heat sinking capacity and may be adequate by itself for certain thermal loads of devices attached. Auxiliary heat sinks 163 may also be attached magnetically with magnets 171 or mechanically with fasteners to any position on either grid surfaces to enhance heat sinking capacity. Auxiliary magnetically attached heat sinks may also include thermal pads or other interface materials and may include floating or fixed magnets. As shown in FIG. 53, magnets 171 are positioned in cavities in the heat sink to increase the magnetic attractive force. If desired, the heat sink may be electrically isolated from the outer surface of the grid by using an electrically insulating interface that has adequate thermal conduction properties for the application (e.g. thermally conductive pads and tapes). Auxiliary heat-sinking structures may also be mechanically installed into features in the grid, such as aluminum rods that screw into threaded holes in the grid, or are press-fitted into holes in the grid.

FIG. 54 and FIG. 55 schematically illustrate the ability to randomly place modules 162 at any position on the grid surface, with the only restriction being that protruding contact 164 must be located in a grid position opening 153. Modules may be placed in uniformly or randomly spaced patterns and rotations. Various sizes and shapes of modules are also compatible with the grid system, as illustrated by the smaller module 173 shown in FIG. 55.

Figure 56:
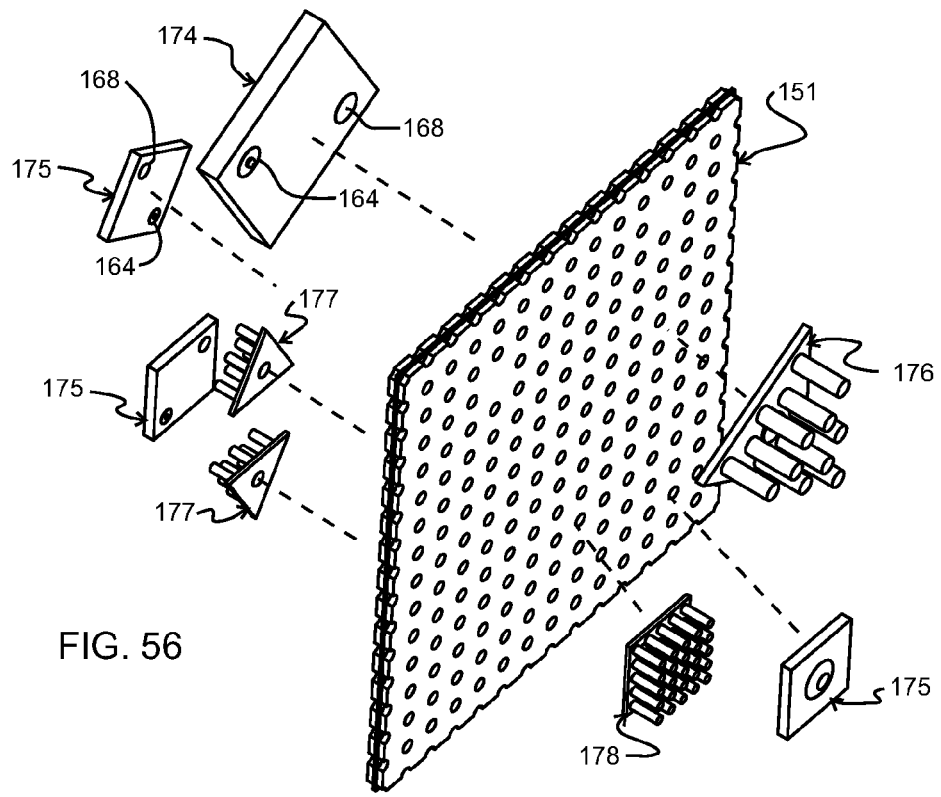
FIG. 56 is an exploded isometric view of grid lighting modules, heat sink modules and a grid.
Figure 57:
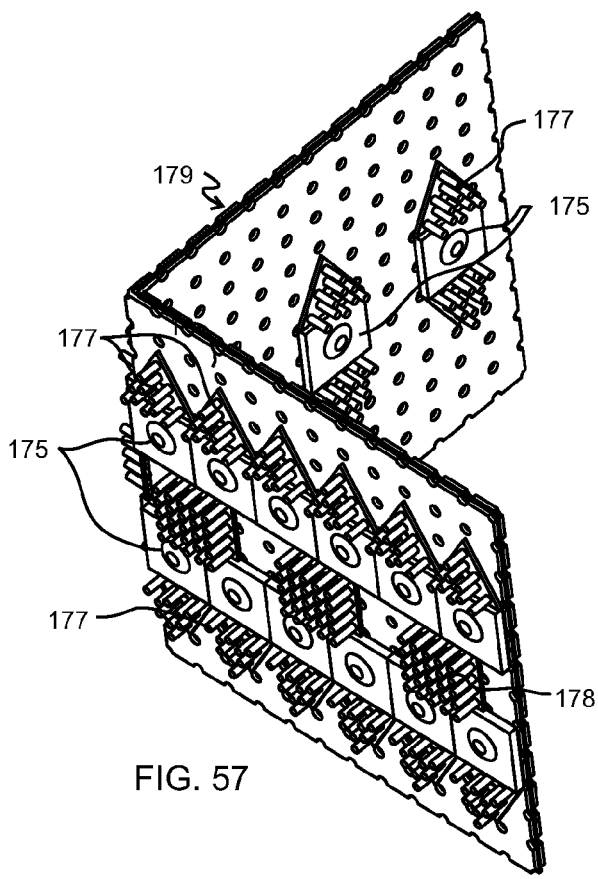
FIG. 57 is an isometric view of grid lighting modules and heat sink modules mounted to a folded grid.

FIG. 56 and FIG. 57 illustrate grid 151 with a variety of sizes and types of configurable magnetic modules (as previously described) attached at varied locations on the grid. FIG. 56 is an isometric exploded view showing a large square module 174, a small square module 175 each with a protruding contact 164, and a planar contact 168, large and small triangular magnetically attached heat sinks 176 and 177 respectively, and square heat sink 178.

FIG. 57 shows an isometric view of the aforementioned components configured in another arrangement. Heat sinks may be of a variety of shapes, sizes, fin orientations etc, and placed on the front and back surfaces as required by the thermal load of attached modules; various thermal interface materials such as thermal greases, tapes, pads, may used between the heat sink and grid surface. FIG. 57 also illustrates a formed angled grid configuration 179. Grids described herein may be bent and folded in curved or planar configurations, or attached with electrical and mechanical fasteners between grid panels. Panels may also be readily cut into different shapes while maintaining the electrical integrity of the grid because of the extended planar layer construction. The grid structure may contain through-holes for air-flow though the grid.

There are many contact configurations of the grid and modules that are possible, including stepped protruding annular contacts, and modules with multiple protruding contacts. Grid structures may include more than two or three electrode layers, with mating stepped or varied height protruding contacts to contact different layers within the grid. Keying and placement selectivity may be tailored by the geometry of the openings in the grid and the mechanical design of the mating contacts. For example (not illustrated), outer electrode layers may contain openings of different diameters and or shapes such that different contact voltages are exposed in a segmented or multi-layer inner electrode. The module may be designed with more than one protruding contact of different diameters, such that one protruding contact would preferably be too large to fit through smaller diameter holes in the outer sheet. A voltage difference across the module would only occur when the larger protruding contact fit through one of the larger diameter holes and the smaller protruding contact fit through one of the smaller diameter holes. In this manner, even higher voltage hot and neutral AC supply voltages may be recessed under a continuous metal plane at ground potential.

Figure 58:
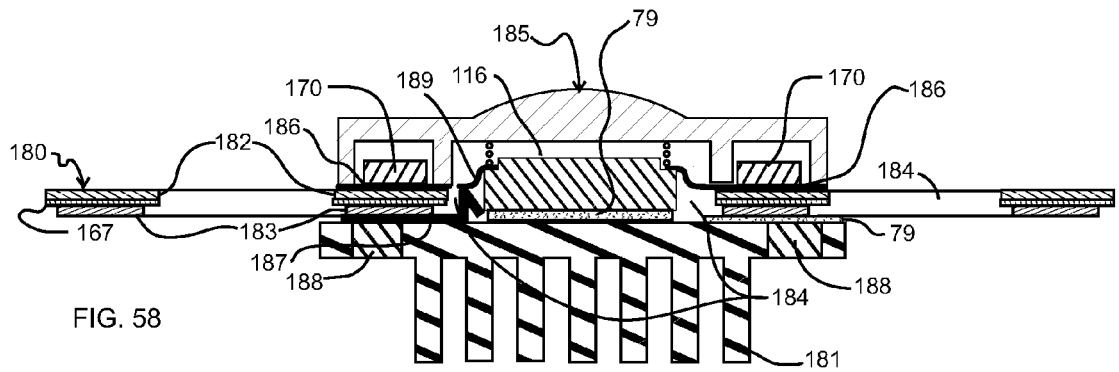
FIG. 58 is a section view of a grid lighting module and heat sink module with an electrode grid with openings.

FIG. 58 illustrates another embodiment of magnetic lighting module 185 is mechanically, electrically and thermally attached to magnetic heat sink 181 and electrode grid 180 in which there are openings 184 in the grid sized to provide a thermal conduction path between the bottom of the substrate of LED subassembly 116 and heat-sink 181. In this embodiment, grid 180 contains a top electrode layer 182 (positive polarity in this example) and a bottom electrode 183 (negative polarity for example) separated by a dielectric layer 167 The bottom electrode layer may be offset or smaller than the top electrode layer, and/or covered with a dielectric along its edges as a safety measure to prevent easy access and contact/shorting of the electrodes from the front working surface of the grid. At least one of the grid electrodes contains a magnetic component. In this example, lighting module 185 is magnetically and electrically attached to the top grid electrode 182 with magnetic force from magnet 170 and magnetically compressed (positive in this example) contacts 186. A bottom electrode contact 187, which may comprise a compliant contact, is configured to be compressed between heat sink 181 and bottom (negative) electrode 183. Heat sink 181 contains magnetic components 188. The force generated between the module, heat sink and grid simultaneously compresses contact 187 to negative LED electrode circuit structure 189, thereby providing positive and negative connection to the LED module circuitry and components. Contact 187 may be part of the MLM 185 or part of the heat sink 181. Heat sink 181 may be modified to be electrically insulating with a coating or film. A thermally conductive pad 79, grease or other thermal interface material may be located between the heat-sink, grid and LED substrate. Similar designs may be used with the top side protruding contact methods, in conjunction with the grid openings which allow contact between the LED substrate and heat-sink surface. Since an LED or a subassembly is spring-loaded/biased, the magnets do not need to be loosely constrained to accommodate some degree of system mechanical variation. However, if there are more than three electrical connections one or more loosely constrained magnets will provide more reliable performance.

In a variation of the embodiment similar to the example of FIG. 58, grid 180 does not require a magnetic component. In this embodiment, the magnetic components of the module and heat sink attract one another through the non-magnetic grid, accomplishing the mechanical, thermal and electrical connection to the grid and from the heat sink to the module. One or both of the module and heat may sink contain a permanent magnet, or permanent magnet and ferromagnetic component combination. It is possible to "key" various mechanical and electrical functions and orientations using the arrangement of the magnetic components (ferromagnetic and permanent magnet), and the polarity of permanent magnetic components utilized. Such keying may be useful in matching appropriate heat sinks with magnetic lighting modules having different cooling requirements.

As described previously, magnetic components may be located directly underlying, overlying or adjacent to electrical contacts and directly actuate the contacts, or displaced from the contacts and indirectly actuate the contacts.

Figure 59:
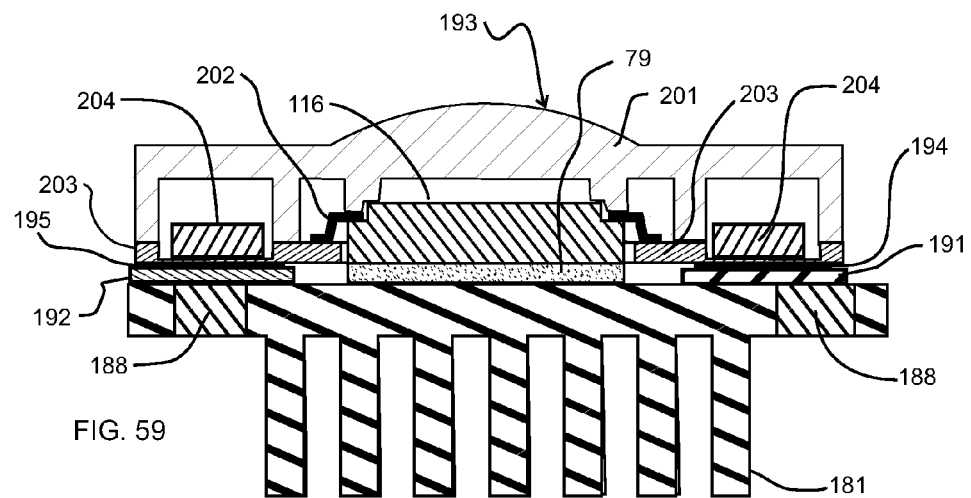
FIG. 59 is a section view of a lighting module and heat sink module attached to track electrodes.

FIG. 59 illustrates an embodiment that utilizes a single layer track or grid 190 using positive electrodes 191 and negative electrodes 192. Similar to the previous example, module 193, heat sink 181 and grid electrodes 191 and 192 are mechanically, electrically and thermally attached with magnetic components 204 contained in module 193 and heat sink 181, through positive contacts 194 and negative contacts 195 to circuitry and components of LED subassembly 116. LED subassembly 116 is compressed against heat sink 181 through a compliant thermal interface material 79 as previously described. In the example of FIG. 59, only the compliant thermal interface material deforms/compresses and no auxiliary springs are utilized. An opening in substrate 203 is present to expose the thermal interface material 79 attached to the bottom of LED subassembly 116. The LED subassembly 116 may be mechanically retained within housing 201 and/or substrate 203. The LED may also be retained and electrically attached by soldering to substrate 203 to pads on the LED and/or leads 202. Electrical interconnection to LED 116 and substrate 203 circuitry may be through soldering, pressure connections directly to substrate 203 or through secondary spring contacts, conductive adhesives, etc. Substrate 203 may be epoxy-glass PCB's, flexible circuits, molded interconnect substrates, ceramic, molded lead-frames or other electronic substrates known in the electronic packaging art.

Also similar to the previous example, electrodes 191 and 192 may be non-magnetic and magnetic components 204 of the module 193 and magnetic components 188 of the heat sink 181 may be attracted to one another directly through the grid or track as shown. The non-magnetic electrodes and support should be kept relatively thin to reduce the distance between the magnetic elements. In an alternate embodiment (unshown) the electrodes comprise a magnetic component (e.g. tin-plated steel) attached to a magnetic or non-magnetic heat sink.

The track may consist of parallel rods suspended in space, or rectangular, circular, or other cross-sections. An open substantially planar grid electrode may also be constructed from formed sheet metal materials with overlapping insulated conductors or insert-molded polymer and metal structures.

Figure 60:
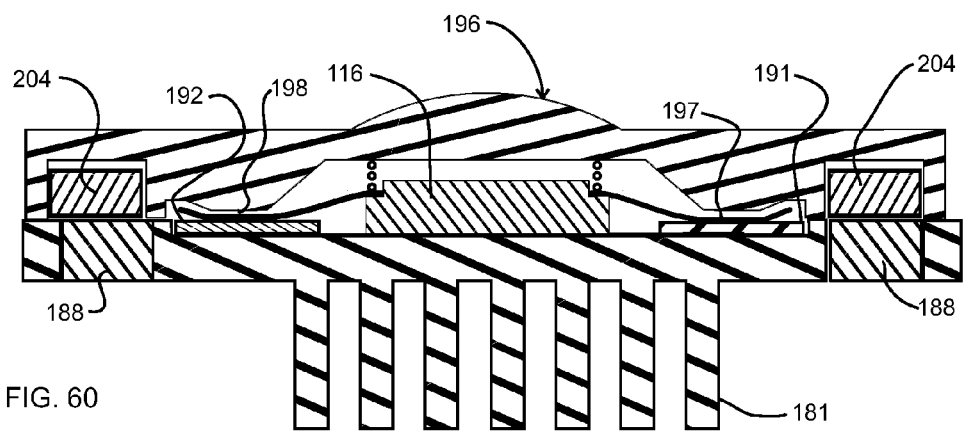
FIG. 60 is a section view of an alternate lighting module and heat sink module attached to track electrodes.

FIG. 60 shows an embodiment where thermal, electrical and mechanical connection is accomplished "indirectly" through the magnetic force directly between the module magnetic components and heat sink magnetic components. The grid does not require magnetic components in this example. Magnetic components are displaced from the module LED electrical contacts 197 (positive polarity) and 198 (negative polarity). The magnetic components of the module 196 and heat sink 181 are located adjacent to one another through openings in the grid and do not interact with the electrode components 191 and 192. Magnetic components (either combinations of permanent magnet-to-permanent magnet or magnet-to-ferromagnetic) in the module and heat sink have the required force to compress contacts 197 and 198 to their respective positive and negative electrodes 191 and 192, and affect thermal contact between the LED 196 and heat sink 181. Due to the compliant loading on the thermal interface from spring 142, magnets 188 and 204 may be fixed in position in the thermal connection pathway and module while providing reliable electrical and thermal conduction connections.

In all of these embodiments, thermal interface materials may be added between the LED subassembly base and the external heat sink.

The contact structures may function as the compliant, spring, or member for mechanical loading of the LED to the heat sink, and the contact structures may provide direct contact to the LED electrodes by pressure connections.

Grids as described herein are not limited to the illustrated examples. For example, a grid may be any linear or area array of positive or negative electrode components and may be fabricated primarily from electrically conductive materials, or a combination of conductors held in position by dielectric materials.

Electrical, mechanical, and thermal interconnections to grids, modules, and heat-sinks described herein may be accomplished using a combination of mechanical and magnetic means.

The heat sink component coupled to the lighting modules described herein may be configured primarily for mechanical and electrical connection of the lighting module to the grid, and have no significant thermal function.

Grid structures may be environmentally sealed by various methods including covering or filling the openings in the outer grid surface with a dielectric tape or elastomer plugs. The grid covering may be removed only where a module connection is desired.

Grid structures may be cut, folded, bent and electrically and mechanically attached in multiple panels.

Those skilled in the art to which the present invention pertains may make modifications resulting in other embodiments employing principles of the present invention without departing from its spirit or characteristics, particularly upon considering the foregoing teachings. Accordingly, the described embodiments are to be considered in all respects only as illustrative, and not restrictive, and the scope of the present invention is, therefore, indicated by the appended claims rather than by the foregoing description or drawings. Consequently, while the present invention has been described with reference to particular embodiments, modifications of structure, sequence, materials and the like apparent to those skilled in the art still fall within the scope of the invention as claimed by the applicant.

What is claimed is:
1. A lighting system comprising:
 a) a lighting module comprising one or more electrically powered LEDs;
 b) a thermal conduction pathway for removing heat from the one or more LEDs;
 c) a lighting fixture for attaching a lighting module comprising electricity for powering the one or more LEDs;
 d) a magnetic connection between the lighting module and the lighting fixture for attaching comprising at least one loosely constrained magnet or material to which a magnet is attracted wherein the thermal conduction pathway does not essentially pass through the magnet;
 e) wherein the electricity is delivered to the one or more LEDs when the lighting module is connected to the lighting fixture via the magnetic connection; and
 f) wherein the one or more LEDs comprise a mechanical bias which holds the one or more LEDs against the thermal conduction pathway to the lighting fixture.

2. The lighting system according to claim 1 wherein the magnetic connection comprises one or more magnets on the lighting module and a magnet or material to which a magnet is attracted is on the lighting fixture positioned for attaching the lighting module to the lighting fixture.

3. The lighting system according to claim 2 wherein the electrical connection passes through the magnetic connection.

4. The lighting system according to claim 1 wherein the magnetic connection comprises one or more magnets on the lighting fixture and a magnet or material to which a magnet is attracted is on the lighting module positioned for attaching the lighting module to the lighting fixture.

5. The lighting system according to claim 1 wherein the magnetic connection is not in a space between the LEDs and the lighting fixture when the lighting module is connected to the lighting fixture.

6. The lighting system according to claim 1 wherein the lighting fixture has at least one recessed electrical connection contact.

7. The lighting system according to claim 1 wherein the lighting module has at least one protruding electrical connection contact.

8. The lighting system according to claim 1 wherein there is a thermal conduction pathway located between the lighting module and the lighting fixture.

9. The lighting system of claim 1 wherein there is a thermal conduction pathway between the one or more LED's and the lighting fixture.

10. The lighting system according to claim 1 wherein at least a portion of the lighting module comprises a material with a high thermal conductivity.

11. The lighting system according to claim 1 wherein there is an electrical contact positioned between the magnetic connections.

12. The lighting system according to claim 11 wherein the electrical contact has a thickness that is less than or equal to 0.3 mm.

13. The lighting system according to claim 11 wherein the electrical contact comprises an electrically conducting coating on the loosely-constrained magnet or material to which a magnet is attracted.

14. The lighting system according to claim 1 wherein the thermal conduction pathway is a heat sink device positioned to remove heat from the one or more LEDs.

15. The lighting system according to claim 14 wherein the heat sink device is positioned between the lighting module and the lighting fixture.

16. The lighting system according to claim 1 wherein there are electrical contacts located against the magnetic connection.

17. The lighting system according to claim 1 wherein a portion of the magnetic connection in the lighting module is recessed in one or more holes in the lighting module.

18. The lighting system according to claim 1 wherein the loosely constrained magnet has movement in two directions.

19. The lighting system according to claim 1 wherein the electrical connection to the one or more LEDs passes at least partially through the magnetic connection.

20. The lighting system according to claim 1 further comprising a substrate wherein deflection of the substrate provides at least a portion of the mechanical bias.

21. The lighting system according to claim 1 wherein the one or more LEDs are recessed in one or more holes in the lighting module.

22. The lighting system according to claim 1 wherein at least a portion of the one or more LEDs is configured to protrude in the direction of the lighting fixture prior to being connected to the lighting fixture.

23. The lighting system according to claim 1 wherein the separation distance between the magnetic elements of the magnetic connection is less than 0.3 mm.

24. The lighting system according to claim 1 wherein the thermal conduction pathway comprises a compressible thermal conduction material.

25. A lighting system comprising
a) a lighting module comprising one or more electrically powered LEDs;
b) a thermal conduction pathway for removing heat from the one or more LEDs;
c) a lighting fixture for attaching a lighting module comprising electricity for powering the one or more LEDs;
d) a magnetic connection between the lighting module and the lighting fixture for attaching comprising at least one loosely constrained magnet or material to which a magnet is attracted wherein the thermal conduction pathway does not essentially pass through the magnet;
e) wherein the electricity is delivered to the one or more LEDs when the lighting module is connected to the lighting fixture via the magnetic connection;
f) wherein at least a portion of the lighting module comprises a material with a high thermal conductivity; and
g) wherein the thermal conduction pathway is through the portion of the lighting module having a high thermal conductivity.

26. A lighting system comprising
a) a lighting module comprising one or more electrically powered LEDs;
b) a thermal conduction pathway for removing heat from the one or more LEDs;
c) a lighting fixture for attaching a lighting module comprising electricity for powering the one or more LEDs;
d) a magnetic connection between the lighting module and the lighting fixture for attaching comprising at least one loosely constrained magnet or material to which a magnet is attracted wherein the thermal conduction pathway does not essentially pass through the magnet;
e) wherein the electricity is delivered to the one or more LEDs when the lighting module is connected to the lighting fixture via the magnetic connection; and
f) wherein a bottom of the one or more LEDs is held against the lighting fixture when the magnetic connection is made.

27. The lighting system according to claim 26 wherein a bottom of the one or more LEDs comprises a compressible thermal conduction material.

28. A lighting system comprising:
a) a lighting module comprising one or more electrically powered LEDs;
b) a thermal conduction pathway;
c) a lighting fixture for attaching a lighting module comprising electricity for powering the one or more LEDs;
d) a magnetic connection wherein components of the magnetic connection are fixed in position; and
e) wherein the one or more LEDs are mechanically biased to be held against the thermal conduction pathway when the lighting module is magnetically attached to the lighting fixture.

29. The lighting system according to claim 28 wherein the thermal conduction pathway is a heat sink.

30. The lighting system according to claim 28 wherein the LEDs are mechanically biased by use of one or more springs.

31. The lighting system according to claim 28 wherein a component of the magnetic connection is located at least partially within a recess.

32. The lighting system according to claim 28 further comprising a substrate wherein deflection of the substrate provides at least a portion of the mechanical bias.

33. The lighting system according to claim 28 wherein the one or more LEDs are recessed in one or more holes in the lighting module.

34. The lighting system according to claim 28 wherein at least a portion of the one or more LEDs is configured to protrude in the direction of the lighting fixture prior to being connected to the lighting fixture.

35. The lighting system according to claim 28 wherein the thermal conduction pathway comprises a compressible thermal conduction material.

36. The lighting system according to claim 28 wherein an electrical connection between the lighting module and the lighting fixture comprises a resilient contact structure compressed by magnetic force.

* * * * *